United States Patent
He et al.

(10) Patent No.: US 12,500,188 B2
(45) Date of Patent: Dec. 16, 2025

(54) FLIP-CHIP BUMPING METAL LAYER AND BUMP STRUCTURE

(71) Applicant: QUALCOMM Incorporated, San Diego, CA (US)

(72) Inventors: Dongming He, San Diego, CA (US); Jun Chen, San Diego, CA (US); Yangyang Sun, San Diego, CA (US); Lily Zhao, San Diego, CA (US); Ahmer Syed, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 381 days.

(21) Appl. No.: 18/313,020

(22) Filed: May 5, 2023

(65) Prior Publication Data

US 2024/0371806 A1 Nov. 7, 2024

(51) Int. Cl.
*H01L 23/00* (2006.01)
*H01L 23/31* (2006.01)

(52) U.S. Cl.
CPC .......... *H01L 24/05* (2013.01); *H01L 23/3171* (2013.01); *H01L 24/11* (2013.01); *H01L 24/13* (2013.01); *H01L 2224/0401* (2013.01); *H01L 2224/05166* (2013.01); *H01L 2224/05572* (2013.01); *H01L 2224/05647* (2013.01); *H01L 2224/1146* (2013.01); *H01L 2224/13147* (2013.01)

(58) Field of Classification Search
CPC ..... H01L 24/05; H01L 23/3171; H01L 24/11; H01L 24/13
See application file for complete search history.

(56) References Cited

U.S. PATENT DOCUMENTS

| | | | |
|---|---|---|---|
| 2009/0115058 A1 | 5/2009 | Yu et al. | |
| 2012/0061823 A1 | 3/2012 | Wu et al. | |
| 2020/0357760 A1* | 11/2020 | Chuang | H01L 23/522 |
| 2021/0098399 A1* | 4/2021 | Huang | H01L 21/02315 |
| 2021/0272913 A1* | 9/2021 | Kim | H01L 21/568 |
| 2021/0351142 A1* | 11/2021 | Yeh | H01L 24/03 |
| 2023/0065794 A1 | 3/2023 | Shue et al. | |
| 2023/0275047 A1* | 8/2023 | Chen | H01L 24/02 |

OTHER PUBLICATIONS

International Search Report and Written Opinion—PCT/US2024/025229—ISA/EPO—Sep. 19, 2024.

* cited by examiner

*Primary Examiner* — Michael Jung
(74) *Attorney, Agent, or Firm* — Muncy, Geissler, Olds & Lowe, P.C.

(57) ABSTRACT

Disclosed are techniques for integrated circuit device. In an aspect, an integrated circuit device includes a metallization structure that includes a top metal layer structure; a passivation layer on the metallization structure; a bump structure disposed on the first bump line structure; and a first polymer protection layer. The passivation layer may include one or more first openings. The first bump line structure may include one or more first extended portions respectively extending toward the top metal layer structure through the one or more first openings. The bump structure may be electrically coupled to the first bump line structure. The first polymer protection layer may be on the passivation layer, on a portion of the first bump line structure, and in contact with a side surface of the first bump line structure.

27 Claims, 22 Drawing Sheets

900 ─⤳

┌─────────────────────────────────────────────────┐
│ Form a first bump line structure above a passivation layer of an │ ── 910
│ integrated circuit device, the integrated circuit device comprising a │
│ metallization structure that includes a top metal layer structure and │
│ the passivation layer on the metallization structure, the passivation │
│ layer including one or more first openings exposing respective one │
│ or more portions of the top metal layer structure, the first bump │
│ line structure being electrically coupled with the top metal layer │
│ structure, and the first bump line structure including one or more │
│ first extended portions respectively extending toward the one or │
│ more portions of the top metal layer structure through the one or │
│ more first openings │
└─────────────────────────────────────────────────┘
                            ↓
┌─────────────────────────────────────────────────┐
│ Form a first polymer protection layer on the passivation layer and │ ── 920
│ in contact with a side surface of the first bump line structure, the │
│ first polymer protection layer including an opening over a first │
│ portion of an upper surface of the first bump line structure, and the │
│ first polymer protection layer being on a second portion of the │
│ upper surface of the first bump line structure │
└─────────────────────────────────────────────────┘
                            ↓
┌─────────────────────────────────────────────────┐
│ Form a second bump line structure over the first polymer │ ── 930
│ protection layer and electrically coupled with the first bump line │
│ structure, the second bump line structure including one or more │
│ second extended portions respectively extending toward the first │
│ portion of the upper surface of the first bump line structure through │
│ one or more second openings of the first polymer protection │
│ polyimide layer │
└─────────────────────────────────────────────────┘
                            ↓
┌─────────────────────────────────────────────────┐
│ Form a bump structure above the first bump line structure and │ ── 940
│ electrically coupled with the first portion of the upper surface of the │
│ first bump line structure │
└─────────────────────────────────────────────────┘

*FIG. 9*

FLIP-CHIP BUMPING METAL LAYER AND BUMP STRUCTURE

TECHNICAL FIELD

The present disclosure generally relates to an integrated circuit device, and more particularly, to an integrated circuit device with a flip-chip bumping metal layer.

BACKGROUND

Integrated circuit (IC) technology has achieved great strides in advancing computing power through miniaturization of electrical components. An IC device may be implemented in the form of an IC chip that has a set of circuits integrated thereon. Also, a plurality of bump structures may be formed on the IC device in order to electrically connecting various terminals of the set of circuits to an external package or an external circuit board. In some implementations, the bump structures of an IC device may be formed based on a bumping technology known as a flip-chip bumping, where the bumps structures may be formed over bump pads formed on top of a metallization structure of the IC device.

Many factors need to be considered when implementing the flip-chip bumping, including the electrical conductivity of a flip-chip bumping metal layer or the bump pads, the protective materials for covering the bump pads, the manufacturing cost, and/or the mechanical integrity of the resulting flip-chip bumping.

Accordingly, in order to further improve the electrical conductivity of the bump pads and to further reduce the cost of manufacturing the bump pads and the corresponding bumping features, there is a need for improved methods for implementing the flip-chip bumping.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, an integrated circuit device includes a metallization structure that includes a top metal layer structure; a passivation layer on the metallization structure, the passivation layer including one or more first openings exposing respective one or more portions of the top metal layer structure; a first bump line structure disposed on the passivation layer and electrically coupled to the top metal layer structure, the first bump line structure including one or more first extended portions respectively extending toward the one or more portions of the top metal layer structure through the one or more first openings; a bump structure above the first bump line structure and electrically coupled to a first portion of an upper surface of the first bump line structure; and a first polymer protection layer on the passivation layer, on a second portion of the upper surface of the first bump line structure, and in contact with a side surface of the first bump line structure.

In an aspect, a method of manufacturing an integrated circuit device includes forming a first bump line structure above a passivation layer of the integrated circuit device, the integrated circuit device comprising a metallization structure that includes a top metal layer structure, and the passivation layer that is on the metallization structure, the passivation layer including one or more first openings exposing respective one or more portions of the top metal layer structure, the first bump line structure being electrically coupled to the top metal layer structure, and the first bump line structure including one or more first extended portions respectively extending toward the one or more portions of the top metal layer structure through the one or more first openings; forming a first polymer protection layer on the passivation layer and in contact with a side surface of the first bump line structure, the first polymer protection layer including an opening exposing a first portion of an upper surface of the first bump line structure, and the first polymer protection layer being on a second portion of the upper surface of the first bump line structure; and forming a bump structure above the first bump line structure and electrically coupled to the first portion of the upper surface of the first bump line structure.

In an aspect, an apparatus includes an integrated circuit device that comprises: a metallization structure that includes a top metal layer structure; a passivation layer on the metallization structure, the passivation layer including one or more first openings exposing respective one or more portions of the top metal layer structure; a first bump line structure above the passivation layer and electrically coupled to the top metal layer structure, the first bump line structure including one or more first extended portions respectively extending toward the one or more portions of the top metal layer structure through the one or more first openings; a bump structure above the first bump line structure and electrically coupled to a first portion of an upper surface of the first bump line structure; and a first polymer protection layer on the passivation layer, on a second portion of the upper surface of the first bump line structure, and in contact with a side surface of the first bump line structure.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIG. 9 illustrates a method for manufacturing an IC device, according to aspects of the disclosure.

Figure 1:
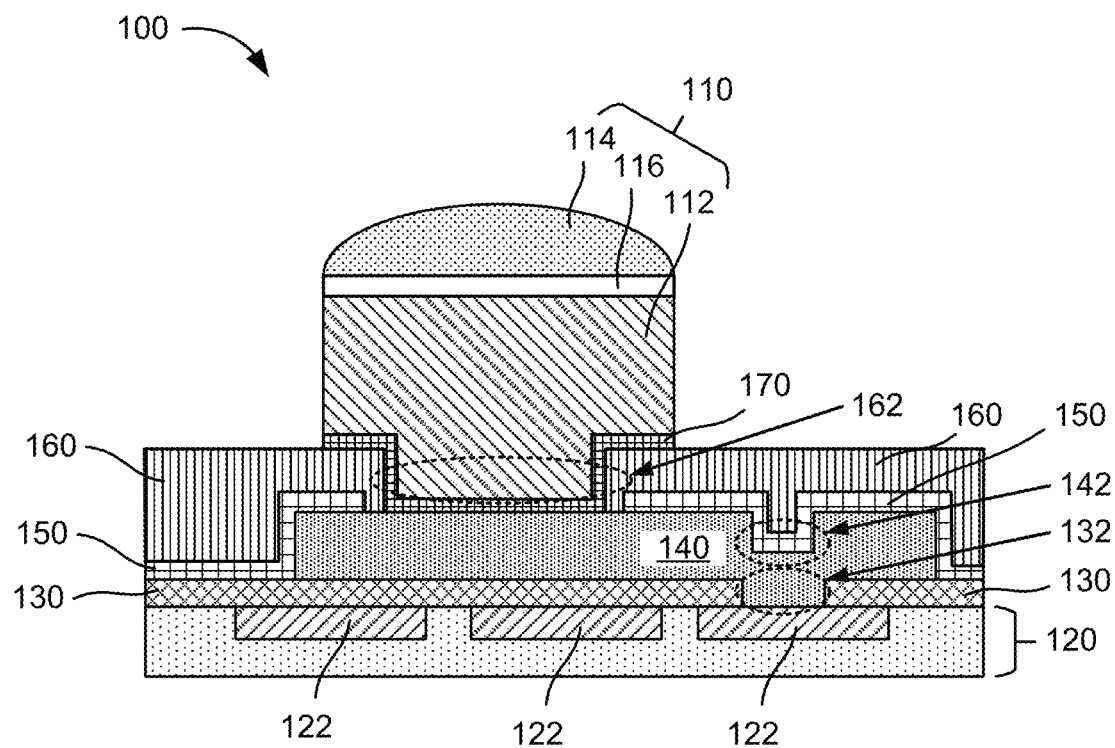
FIG. 1 is a cross-sectional view of a portion of an integrated circuit (IC) device, according to aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

Various aspects relate generally to an integrated circuit device and a manufacturing method of making the integrated circuit device. Some aspects more specifically relate to an integrated circuit device with a flip-chip bumping metal layer. In some examples, the bump line structures described in this disclosure may correspond to one or more flip-chip bumping metal layers and may be used in place of a metal pad (e.g., an aluminum bond pad).

Particular aspects of the subject matter described in this disclosure can be implemented to realize one or more of the following potential advantages. In some examples, by forming a bump line structure in place of the aluminum bond pad, the described techniques can be used to improve the conductivity of the flip-chip bumping and to allow the flexibility in selecting the manufacturing service vendors at different manufacturing stages and/or balancing the overall costs of integrated circuit devices manufacturing and distribution.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

FIG. 1 is a cross-sectional view of a portion of an integrated circuit (IC) device 100, according to aspects of the disclosure. The IC device 100 depicted in FIG. 1 only shows the portion of the IC device 100 in the proximity of a bump structure 110. In some aspects, the IC device 100 may further include a substrate and active and passive electrical components formed on the substrate, which are not shown in FIG. 1. The IC device 100 may further include a metallization structure 120 over the substrate and the active and passive electrical components, which is only partially depicted in FIG. 1.

As shown in FIG. 1, the IC device 100 includes the bump structure 110 and the metallization structure 120. The bump structure 110 may include a metal pillar 112, a solder portion 114 above the metal pillar 112, and a diffusion buffer layer 116 disposed between the metal pillar 112 and the solder portion 114. In some aspects, the metal pillar 112 may be a copper pillar that comprise substantially copper. In some aspects, the diffusion buffer layer 116 may comprise nickel. In some aspects, the diffusion buffer layer 116 may be omitted, and the solder portion 114 may be disposed on the metal pillar 112. In some aspects, the bump structure 110 may include only the solder portion 114, and the metal pillar 112 and the diffusion buffer layer 116 may be omitted. In some aspects, the bump structure 110 may include only the metal pillar 112, and the solder portion 114 and the diffusion buffer layer 116 may be omitted.

The metallization structure 120 may include a top metal layer structure 122. A first passivation layer 130 may be formed on the metallization structure 120. In some aspects, the first passivation layer 130 may include an opening 132 that exposes a portion of the top metal layer structure 122. A metal pad 140 may be formed on the first passivation layer 130 and connected with the exposed portion of the top metal layer 122 through the opening 132. A second passivation layer 150 may be formed on the first passivation layer 130 and on a portion of an upper surface of the metal pad 140. Moreover, a polyimide layer 160 may be formed on the second passivation layer 150.

The polyimide layer 160 may include an opening 162 that exposes another portion of the upper surface of the metal pad 140. A under bump metallization (UBM) structure 170 may be formed on the exposed portion of the upper surface of the metal pad 140. The UBM structure 170 may have a lower surface in contact with the exposed portion of the upper surface of the metal pad 140. Also, the bump structure 110 may be in contact with an upper surface of the UBM structure 170.

In some aspects, the metal pad 140 is usually made of aluminum or aluminum alloy and thus may also referred to as an aluminum bump pad. In some aspects, the first passivation layer 130 and the second passivation layer 150 may include silicon oxide, silicon nitride, or a combination thereof. In some aspects, the aluminum bump pad may be formed based on a physical vapor deposition (PVD) process and thus may leave a dimple or recess 142 above the opening 132. In some aspects, the bump structure 110 is usually formed on a substantially planar surface, and the metal pad 140 may need to shift the location of the dimple or recess 142 (i.e., where the metal pad connects the underlying top metal layer structure 122) away from being directly under the bump structure 110. Accordingly, a greater pitch or spacing between neighboring bump structures may be needed in order to accommodate the additional area for the metal pad 140 to form the electrical connection to the underlying top metal layer structure 122 while accommodating the formation of the dimple or recess 142.

In addition, aluminum bump pads may have higher resistivity than other conductive patterns and vias of the metallization structure 120 of the IC device 100 or in a packaging substrate for carrying the IC device 100 (e.g., the conductive patterns and vias that comprise substantially copper of greater than 90 weight percentage (wt %)). Also, a passivation layer (e.g., the second passivation layer 150) may be needed over the aluminum bump pads in order to protect the aluminum bump pads from corrosion. The passivation layer over the aluminum bump pads is usually formed using a chemical vapor deposition (CVD) process and may crack due to stress and surface topography. The cost for manufacturing the aluminum bump pads and the passivation layer thus may be expensive.

Figure 2A:
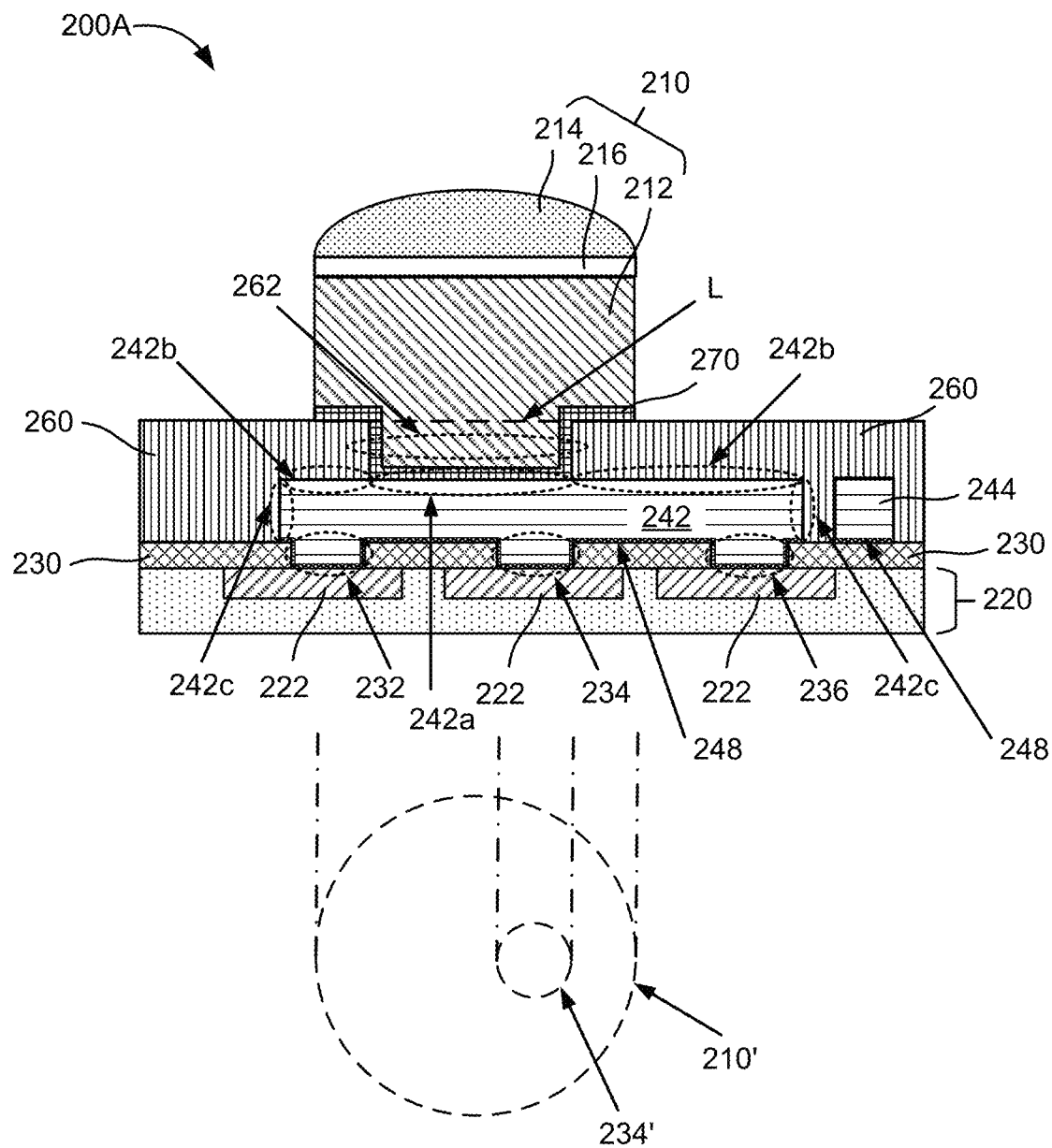
FIGS. 2A-2C are cross-sectional views of portions of IC device examples, according to aspects of the disclosure.

FIG. 2A is a cross-sectional view of a portion of an IC device example 200A, according to aspects of the disclosure. The IC device 200A depicted in FIG. 2A only shows the portion of the IC device 200A in the proximity of a bump structure 210. In some aspects, the IC device 200A may further include a substrate and active and passive electrical components formed on the substrate, which are not shown in FIG. 2A. The IC device 200A may further include a metallization structure 220 over the substrate and the active and passive electrical components, which is only partially depicted in FIG. 2A.

As shown in FIG. 2A, the IC device 200A includes the bump structure 210 and the metallization structure 220. The bump structure 210 may include a metal pillar 212, a solder portion 214 over the metal pillar 212, and a diffusion buffer layer 216 disposed between the metal pillar 112 and the solder portion 114. In some aspects, the metal pillar 212 may be a copper pillar that comprise substantially copper. In some aspects, the bump structure 210 may correspond to the bump structure 110 in FIG. 1.

The metallization structure 220 may include a top metal layer structure 222. A passivation layer 230 may be formed on the metallization structure 220. In some aspects, the passivation layer 230 may include one or more openings 232, 234, and 236 that expose one or more portions of the top metal layer structure 222. In some aspects, the passivation layer 230 may include silicon oxide, silicon nitride, or a combination thereof. In some aspects, the metallization structure 220 may correspond to the metallization structure 120 in FIG. 1. In some aspects, the top metal layer structure 222 may be formed based on a damascene process. In some aspects, the top metal layer structure 222 may be formed based on a minimum top metal width and a minimum top metal spacing. In some aspects, the minimum top metal width may be equal to or greater than 0.36 micrometers (μm), and the minimum top metal spacing may be equal to or greater than 0.36 μm.

As shown in FIG. 2A, one or more first bump line structures 242 and 244 may be formed above the passivation layer 230. In some aspects, there may be a UBM structure 248 between the first bump line structures 242 and 244 and the passivation layer 230. In some aspects, the UBM structure 248 may be omitted.

The first bump line structures 242 may be electrically coupled to the exposed one or more portions of the top metal layer structure 222. The first bump line structures 242 may include extended portions respectively extending toward the one or more portions of the top metal layer structure 222 through the one or more openings 232, 234, and 236. The bump structure 210 may be formed above the first bump line structure 242 and electrically coupled to a first portion 242a of an upper surface of the first bump line structure 242. Moreover, a polymer protection layer 260 may be formed on the passivation layer 230, on a second portion 242b of the upper surface of the first bump line structure 242, and in contact with a side surface 242c of the first bump line structure 242. In some aspects, the polymer protection layer 260 may include polyimide.

The polymer protection layer 260 may include an opening 262 that exposes the first portion 242a of the upper surface of the first bump line structure 242. A UBM structure 270 may be formed on the exposed portion (e.g., the first portion 242a) of the upper surface of the first bump line structure 242. For example, the UBM structure 270 may have a lower surface in contact with the exposed portion 242a of the upper surface of the first bump line structure 242. Also, the UBM structure 270 may be formed under and in contact with the bump structure 210. For example, the bump structure 210 may be in contact with an upper surface of the UBM structure 270.

In some aspects, the bump structure 210 may have a lower portion below an upper surface of the polymer protection layer 260 (e.g., the portion below the reference line L that is substantially level with an upper surface of the polymer protection layer 260) and an upper portion above the upper surface of the polymer protection layer 260 (e.g., the portion above the reference line L). In some aspects, the upper portion of the bump structure 210 may extend beyond the opening 262 and over a portion of the upper surface of the polymer protection layer 260. In some aspects, a width of the upper portion of the bump structure 210 may be greater than a width of the lower portion of the bump structure 210.

In some aspects, the UBM 270 structure may be omitted, and the bump structure 210 may be in contact with the exposed portion 242a of the upper surface of the first bump line structure 242. In some aspects, in the absence of the UBM 270 structure, the polymer protection layer 260 may be in contact with the lower portion of the bump structure 210.

In some aspects, the one or more first bump line structures 242 and 244 may comprise copper of greater than 90 wt %. In some aspects, the one or more first bump line structures 242 and 244 may comprise copper of greater than 99.99 wt %. In some aspects, the one or more first bump line structures 242 and 244 may be formed based on a first minimum line width and a first minimum line spacing. In some aspects, the first minimum line width may be equal to or greater than 1.0 μm, and the first minimum line spacing may be equal to or greater than 1.0 µm. In some aspects, the first minimum line width may be equal to or greater than 1.5 or 1.8 µm, and the first minimum line spacing may be equal to or greater than 1.5 or 1.8 µm. In some aspects, the first bump line structure 242 may correspond to a flip-chip bumping metal layer in this disclosure.

In some aspects, as the first bump line structure 242 may be formed based on deposition or plating of copper, an upper surface of the first bump line structure 242 above any of the opening 232, 234, 236 may be sufficiently planar compared with the dimple or recess 142 of the metal pad 140 above the opening 132 in FIG. 1. Accordingly, one or more openings may be formed in the passivation layer 230 right underneath the bump structure 210. In other words, a projection 234' of one of the one or more openings (e.g., the opening 234) from a top-view perspective may be arranged to be within a projection 210' of the bump structure 210 from the top-view perspective.

In some aspects, as the first bump line structure 242 comprises substantially copper, compared with the aluminum bump pad example in FIG. 1, the second passivation layer 150 may be omitted in the example of FIG. 2A. Also, copper may have a greater conductivity than aluminum. Forming the first bump line structure 242 in place of the aluminum bump pad example in FIG. 1 may increase the electrical performance and lower the voltage drop due to the better conductivity of copper. In some aspects, as the opening 232, 234, and 236 in the passivation layer 230 may be formed close or even under the bump structure 210, the spacing between two adjacent bump structures in the IC device 200A may be smaller than the spacing between two adjacent bump structures in the IC device 100. In addition, the portion of the structure at and above the first bump line structure 242 may be formed in either a semiconductor manufacturing foundry or an outsourced semiconductor assembly and test (OSAT) vendor, which allows the flexibility in selecting the service vendors and/or balancing the overall costs of IC devices manufacturing and distribution.

The example as shown in FIG. 2A may have different variations as further illustrated with reference to FIGS. 2B, 2C, 3, and 4A-4C.

Figure 2B:
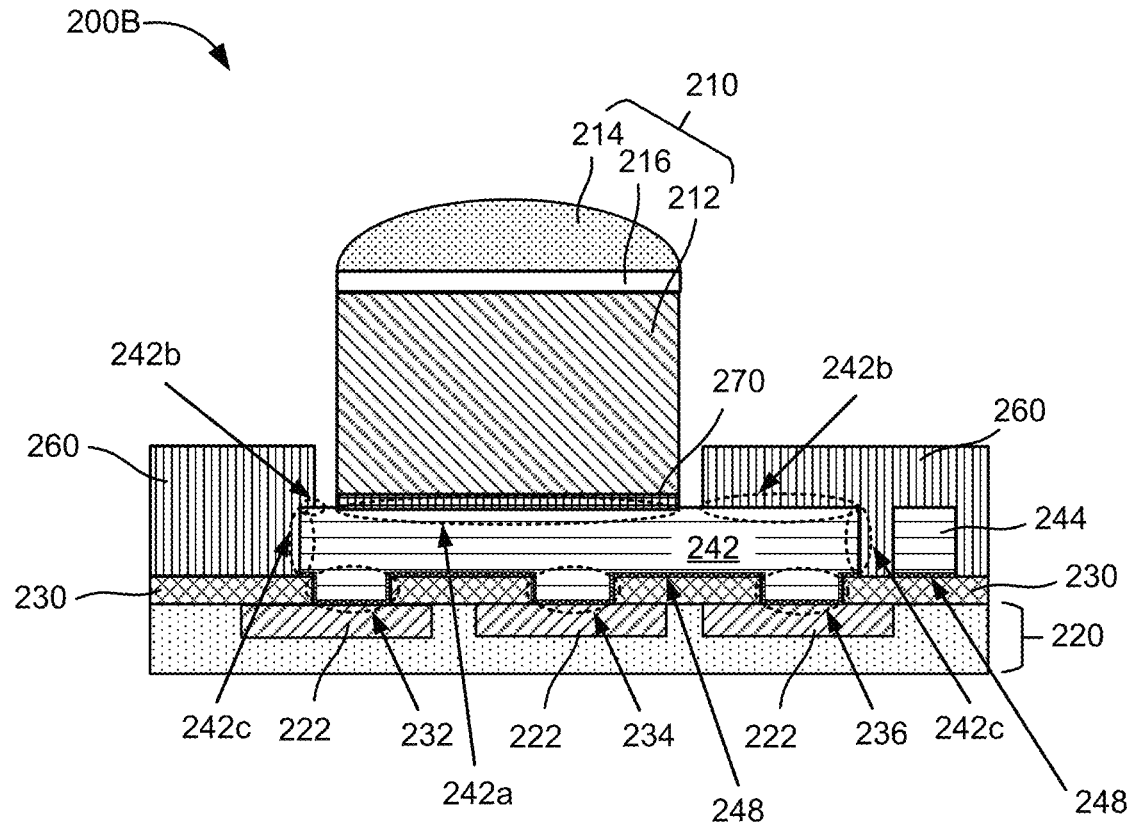

FIG. 2B is a cross-sectional view of a portion of an IC device example 200B, according to aspects of the disclosure. In some aspects, the IC device 200B may be a variation of the IC device 200A. Accordingly, the components of the IC device 200B that are the same or similar to those of the IC device 200A are given the same reference numbers and shades, and the detailed description thereof may be omitted.

As shown in FIG. 2B, the UBM structure 270 may have a lower surface in contact with a first portion 242a of an upper surface of a first bump line structure 242. In some aspects, the UBM structure 270 may be omitted, and the bump structure 210 may be in contact with the first portion 242a of the upper surface of a first bump line structure 242. The polymer protection layer 260 may be on the passivation layer 230 and on a second portion 242b of the upper surface of the first bump line structure 242, and in contact with a side surface 242c of the first bump line structure 242. In this example, the polymer protection layer 260 is not in contact with the bump structure 210. In some aspects, compared with the example shown in FIG. 2A, the example shown in FIG. 2B may be more suitable for forming smaller bump structures and/or smaller spacing between bumps structures.

Figure 2C:
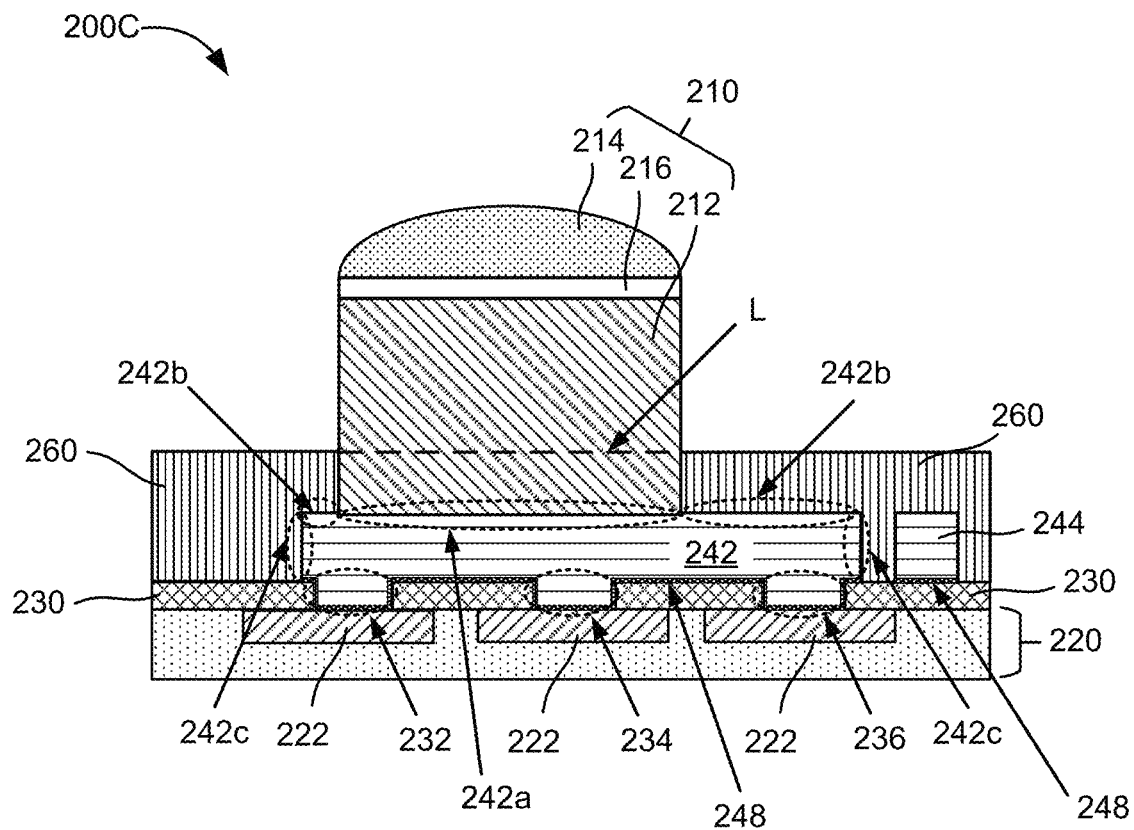

FIG. 2C is a cross-sectional view of a portion of an IC device example 200C, according to aspects of the disclosure. In some aspects, the IC device 200C may be a variation of the IC device 200A. Accordingly, the components of the IC device 200C that are the same or similar to those of the IC device 200A are given the same reference numbers and shades, and the detailed description thereof may be omitted.

As shown in FIG. 2C, the IC device 200C may not have UBM structure 270, and the bottom of the bump structure 210 may be in contact with the first portion 242a of the upper surface of the first bump line structure 242. In some aspects, the polymer protection layer 260 may be formed after the formation of the bump structure 210 and may be in contact with a lower portion of the bump structure 210 (e.g., the portion below the reference line L that is substantially level with an upper surface of the polymer protection layer 260).

Figure 3:
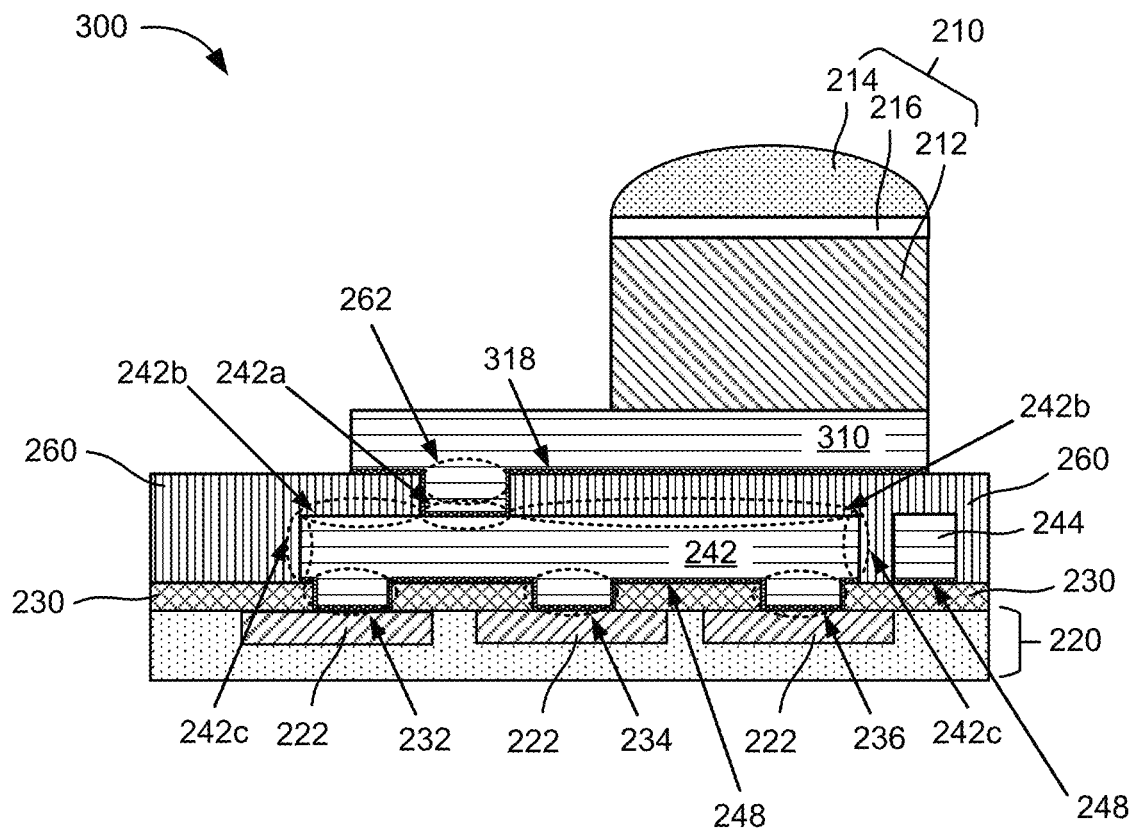
FIG. 3 is a cross-sectional view of a portion of an IC device example, according to aspects of the disclosure.

FIG. 3 is a cross-sectional view of a portion of an IC device example 300, according to aspects of the disclosure. In some aspects, the IC device 300 may be a variation of the IC device 200A. Accordingly, the components of the IC device 300 that are the same or similar to those of the IC device 200A are given the same reference numbers and shades, and the detailed description thereof may be omitted.

As shown in FIG. 3, the IC device 300 further includes a second bump line structure 310 over the polymer protection layer 260 and electrically coupled to the first portion 242a of the upper surface of the first bump line structure 242. The polymer protection layer 260 may include an opening 262 that exposes the first portion 242a of the upper surface of the first bump line structure 242. The second bump line structure 310 may include an extended portion extending toward the first portion 242a of the upper surface of the first bump line structure 242 through the opening 262 of the first polymer protection layer 260.

In some aspects, there may be a UBM structure 318 between the second bump line structure 310 and the polymer protection layer 260, and between the second bump line structure 310 and the bottom and sidewalls of the opening 262. In some aspects, the UBM structure 318 may be omitted, and the extended portion of the second bump line structure 310 may be in contact with the first portion 242a of the upper surface of the first bump line structure 242.

In some aspects, the bump structure 210 may be formed over the second bump line structure 310. As shown in FIG. 3, there is no UBM layer between the bump structure 210 and the second bump line structure 310, and the bump structure 210 is in contact with an upper surface of the second bump line structure 310. In some aspects, there may be a UBM layer disposed between the bump structure 210 and the second bump line structure 310. Also, the bump structure 210 is disposed away from being over the opening 262. In some aspects, the bump structure 210 may be disposed over the opening 262.

In some aspects, the second bump line structure 310 may comprise copper of greater than 90 wt %. In some aspects, the second bump line structure 310 may comprise copper of greater than 99.99 wt %. In some aspects, the second bump line structure 310 may be formed based on a second minimum line width and a second minimum line spacing. In some aspects, the second minimum line width and/or the second minimum line spacing may be the same as or greater than the first minimum line width and/or the first minimum line spacing discussed above. In some aspects, the second minimum line width may be equal to or greater than 5.0 µm, and the second minimum line spacing may be equal to or greater than 5.0 µm. In some aspects, the second minimum line width may be equal to or greater than 10.0 µm, and the second minimum line spacing may be equal to or greater than 10.0 µm. In some aspects, the second bump line structure 310 may correspond to another flip-chip bumping metal layer in this disclosure.

Figure 4A:
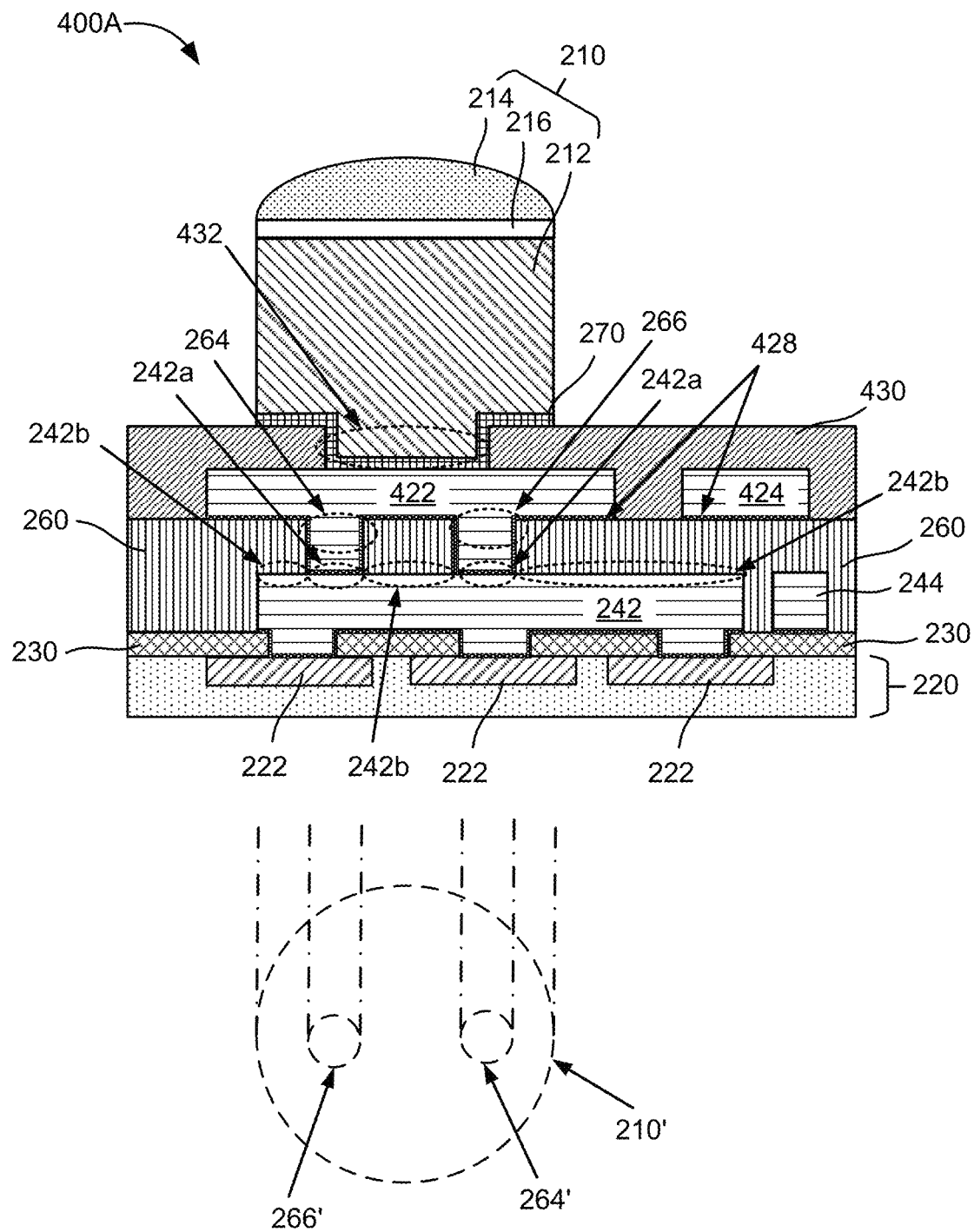
FIGS. 4A-4C are cross-sectional views of portions of IC device examples, according to aspects of the disclosure.

FIG. 4A is a cross-sectional view of a portion of an IC device example 400A, according to aspects of the disclosure. In some aspects, the IC device 400A may be a variation of the IC device 200A. Accordingly, the components of the IC device 400A that are the same or similar to those of the IC device 200A are given the same reference numbers and shades, and the detailed description thereof may be omitted.

As shown in FIG. 4A, the IC device 400A further includes one or more second bump line structure 422 and 424 over the polymer protection layer 260 and electrically coupled to the first portion 242a of the upper surface of the first bump line structure 242. The polymer protection layer 260 may include one or more openings 264 and 266 that expose the first portion 242a of the upper surface of the first bump line structure 242. The second bump line structure 422 may include one or more extended portions respectively extending toward the first portion 242a of the upper surface of the first bump line structure 242 through the one or more openings 264 and 266 of the polymer protection layer 260.

In some aspects, there may be a UBM structure 428 between the second bump line structure 310 and the polymer protection layer 260, and between the one or more second bump line structures 422 and 424 and the bottoms and sidewalls of the openings 264 and 266. In some aspects, the UBM structure 428 may be omitted, and the one or more extended portions of the second bump line structure 422 may be in contact with the first portion 242a of the upper surface of the first bump line structure 242.

As shown in FIG. 4A, the IC device 400A further includes another polymer protection layer 430 on the polymer protection layer 260, on a portion of the upper surface of the second bump line structure 422, and in contact with a side surface of the second bump line structure 422. In some aspects, the polymer protection layer 430 may include an opening 432 that exposes another portion of the upper surface of the second bump line structure 422. In some aspects, the UBM structure 270 may be formed under and in contact with the bump structure 210 and may be formed on the exposed portion of the upper surface of the second bump line structure 422. In some aspects, the UBM 270 structure may be omitted, and the bump structure 210 may be in contact with the exposed portion of the upper surface of the second bump line structure 422.

In some aspects, the bump structure 210 may have a lower portion below an upper surface of the polymer protection layer 430 and an upper portion above the upper surface of the polymer protection layer 430. In some aspects, the upper portion of the bump structure 210 may extend beyond the opening 432 and over a portion of the upper surface of the polymer protection layer 430. In some aspects, a width of the upper portion of the bump structure 210 above the upper surface of the polymer protection layer 430 may be greater than a width of the lower portion of the bump structure 210 below the upper surface of the polymer protection layer 430.

In some aspects, the one or more second bump line structures 422 and 424 may comprise copper of greater than 90 wt %. In some aspects, the one or more second bump line structures 422 and 424 may comprise copper of greater than 99.99 wt %. In some aspects, the one or more second bump line structures 422 and 424 may be formed based on a second minimum line width and a second minimum line spacing. In some aspects, the second minimum line width and/or the second minimum line spacing may be the same as or greater than the first minimum line width and/or the first minimum line spacing discussed above. In some aspects, the second minimum line width may be equal to or greater than 5.0 µm, and the second minimum line spacing may be equal to or greater than 5.0 µm. In some aspects, the one or more second bump line structures 422 and 424 may correspond to another flip-chip bumping metal layer in this disclosure.

Moreover, one or more openings 264 and 266 may be formed in the polymer protection layer 260 right underneath the bump structure 210. In other words, a projection 264' or 266' of one of the one or more openings (e.g., one of the openings 264 and 266, or both) from a top-view perspective may be arranged to be within a projection 210' of the bump structure 210 from the top-view perspective.

Figure 4B:
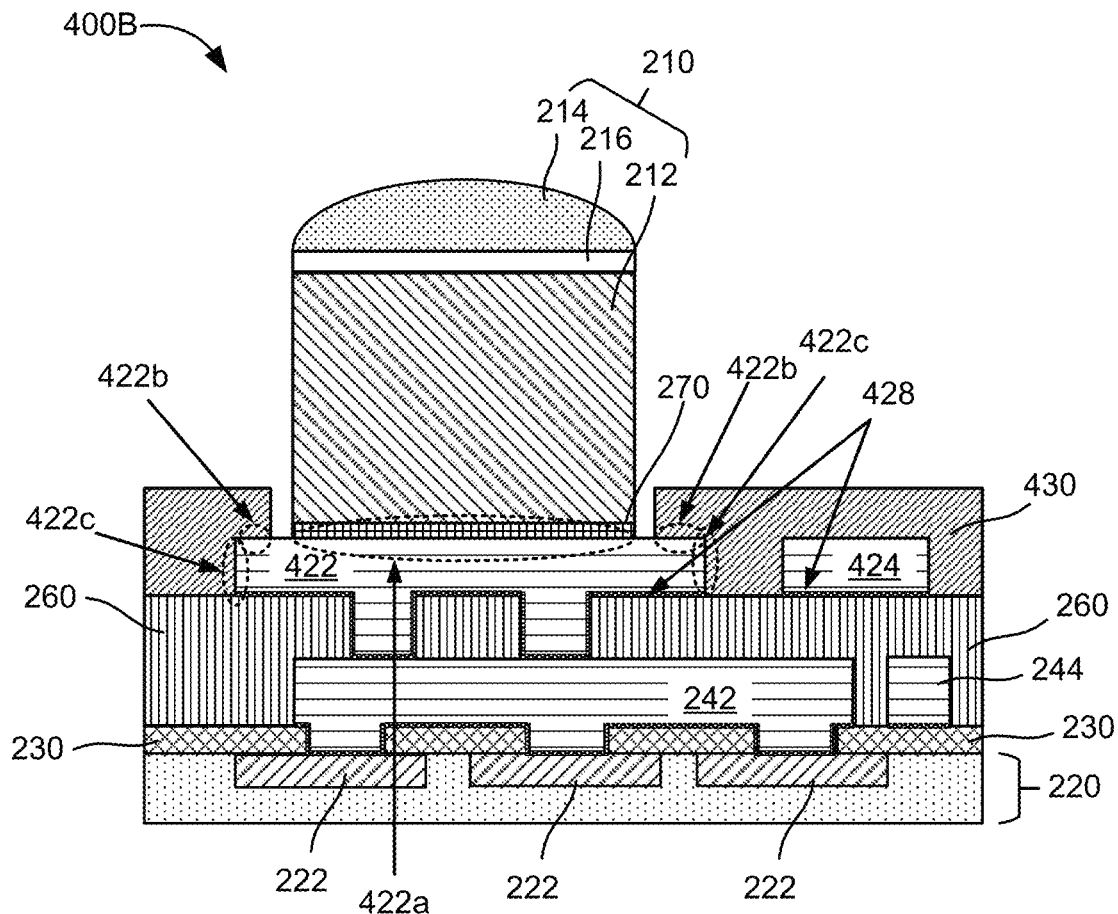

FIG. 4B is a cross-sectional view of a portion of an IC device example 400B, according to aspects of the disclosure. In some aspects, the IC device 400B may be a variation of the IC device 200A or the IC device 400A. Accordingly, the components of the IC device 200B that are the same or similar to those of the IC device 200A or the IC device 400A are given the same reference numbers and shades, and the detailed description thereof may be omitted.

As shown in FIG. 4B, the UBM structure 270 may have a lower surface in contact with a portion 422a of an upper surface of a second bump line structure 422. In some aspects, the UBM structure 270 may be omitted, and the bump structure 210 may be in contact with the portion 422a of the upper surface of the second bump line structure 422. The polymer protection layer 430 may be on a portion 422b of the upper surface of the second bump line structure 422, and in contact with a side surface 242c of the second bump line structure 422. In this example, the polymer protection layer 430 is not in contact with the bump structure 210.

Figure 4C:
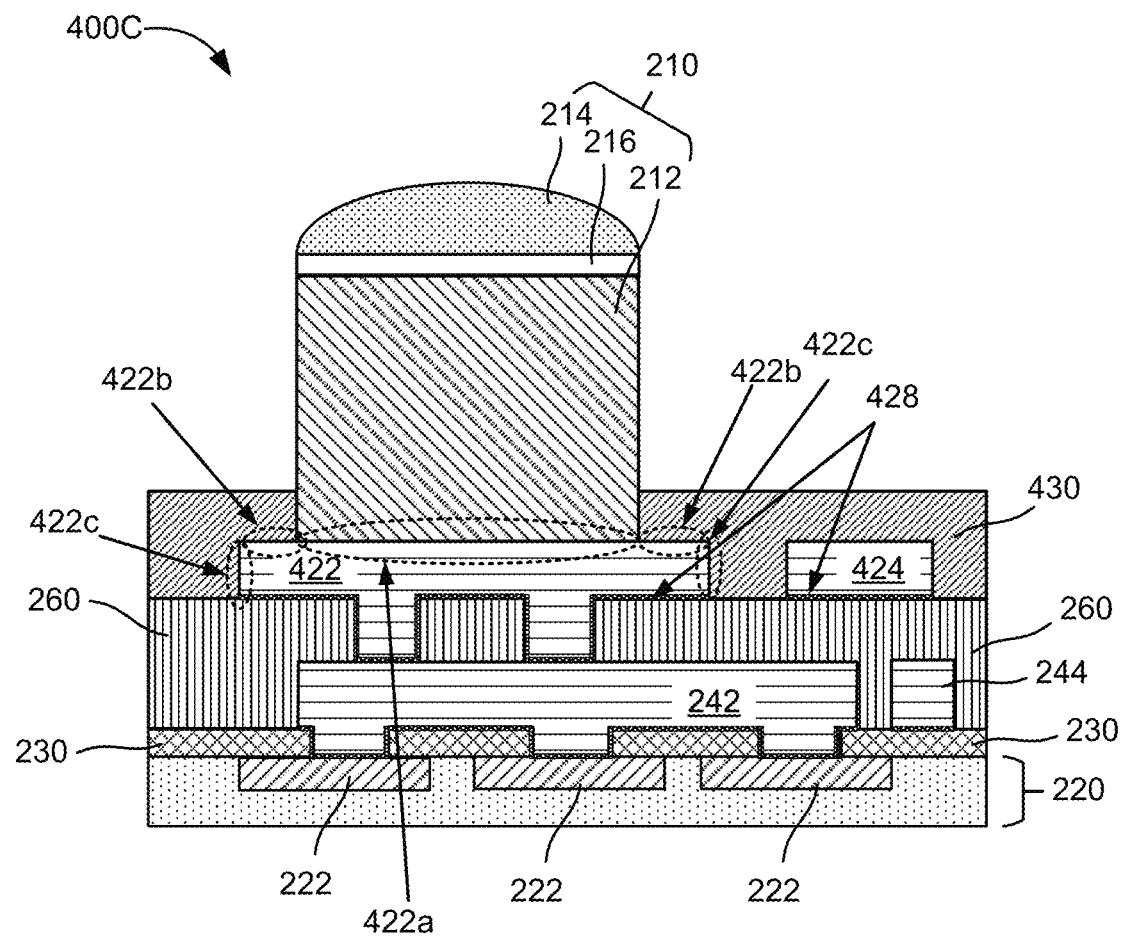

FIG. 4C is a cross-sectional view of a portion of an IC device example 400C, according to aspects of the disclosure. In some aspects, the IC device 400C may be a variation of the IC device 200A or the IC device 400A. Accordingly, the components of the IC device 400C that are the same or similar to those of the IC device 200A or the IC device 400A are given the same reference numbers and shades, and the detailed description thereof may be omitted.

As shown in FIG. 4C, the IC device 400C may not have UBM structure 270, and the bottom of the bump structure 210 may be in contact with the portion 422a of the upper surface of the second bump line structure 422. In some aspects, the polymer protection layer 430 may be formed after the formation of the bump structure 210 and may be in contact with a lower portion of the bump structure 210 below the upper surface of the polymer protection layer 430.

FIGS. 5A-5L illustrate structures at various stages of manufacturing an example IC device of FIG. 2A, according to aspects of the disclosure. The components illustrated in FIGS. 5A-5L that are the same or similar to those of FIG. 2A are given the same reference numbers, and the detailed description thereof may be omitted.

Figure 5A:
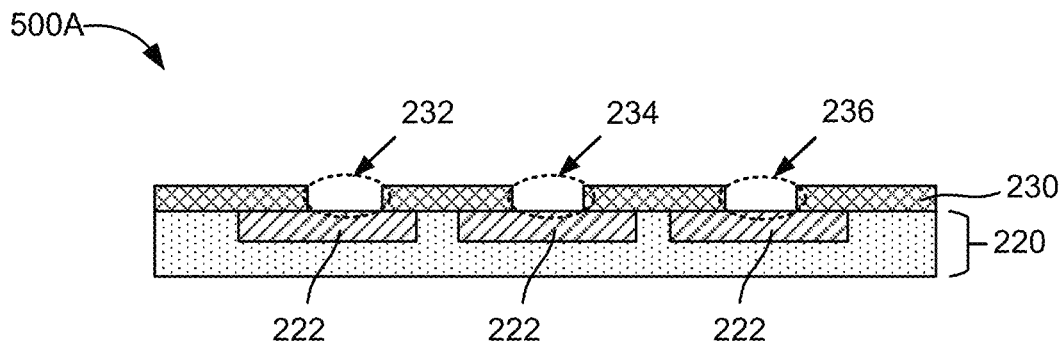
FIGS. 5A-5L illustrate structures at various stages of manufacturing an example IC device of FIG. 2A, according to aspects of the disclosure.

As shown in FIG. 5A, a structure 500A is provided. The structure 500A includes a metallization structure 220 and a passivation layer 230 on the metallization structure 220. The metallization structure 220 may include a top metal layer structure 222. In some aspects, the passivation layer 230 may include one or more openings 232, 234, and 236 that expose one or more portions of the top metal layer structure 222.

In some aspects, the passivation layer 230 may include silicon oxide, silicon nitride, or a combination thereof. In some aspects, the top metal layer structure 222 may comprise substantially copper of greater than 90 wt %). In some aspects, the top metal layer structure 222 may be formed based on a minimum top metal width and a minimum top metal spacing. In some aspects, the top metal layer structure 222 may be formed based on a damascene process. In some aspects, the minimum top metal width may be equal to or greater than 0.36 µm, and the minimum top metal spacing may be equal to or greater than 0.36 µm.

Figure 5B:
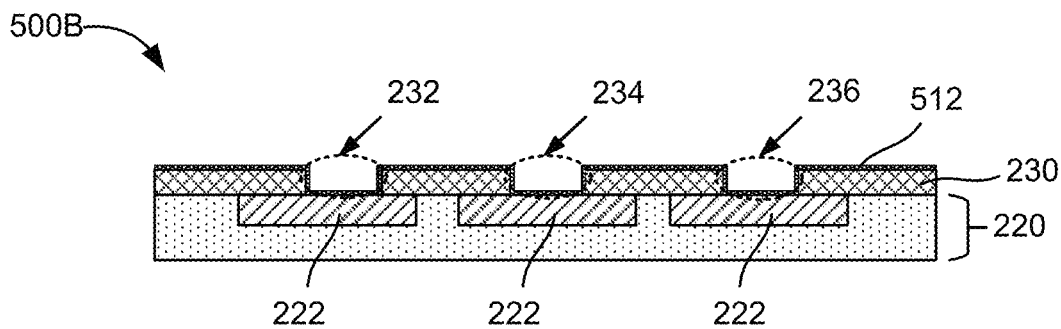

As shown in FIG. 5B, a structure 500B is formed based on the structure 500A by forming a UBM layer 512 on an upper surface of the passivation layer 230, on the exposed one or more portions of the top metal layer structure 222, and on the sidewalls of the one or more openings 232, 234, and 236. In some aspects, the UBM layer 512 may include layers of materials, which may be a combination of thin layers of titanium, copper, tungsten, or an alloy thereof. In some aspects, the layers of materials of the UBM layer 512 may be formed based on a PVD process.

Figure 5C:
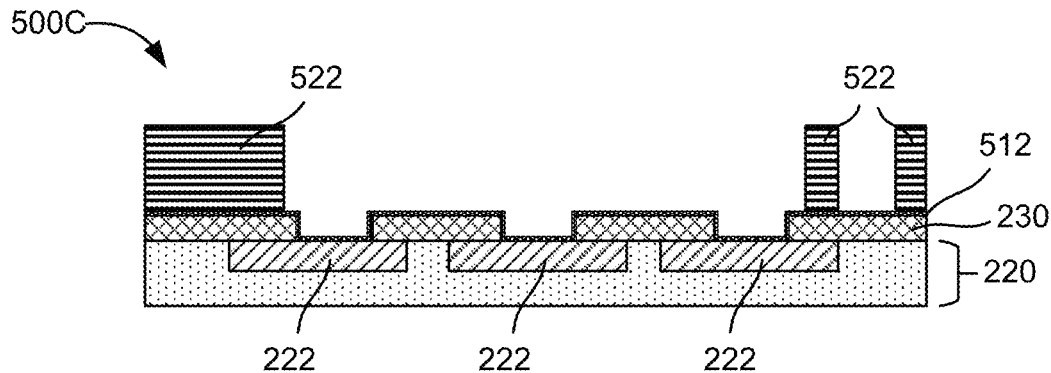

As shown in FIG. 5C, a structure 500C is formed based on the structure 500B by forming a patterned photoresist layer 522 over the UBM layer 512. The forming of the patterned photoresist layer 522 may include forming a layer of photoresist material, exposing the layer of photoresist material to a light source with a photomask, and developing and removing a portion of the layer of photoresist material and leaving the patterned photoresist layer 522.

Figure 5D:
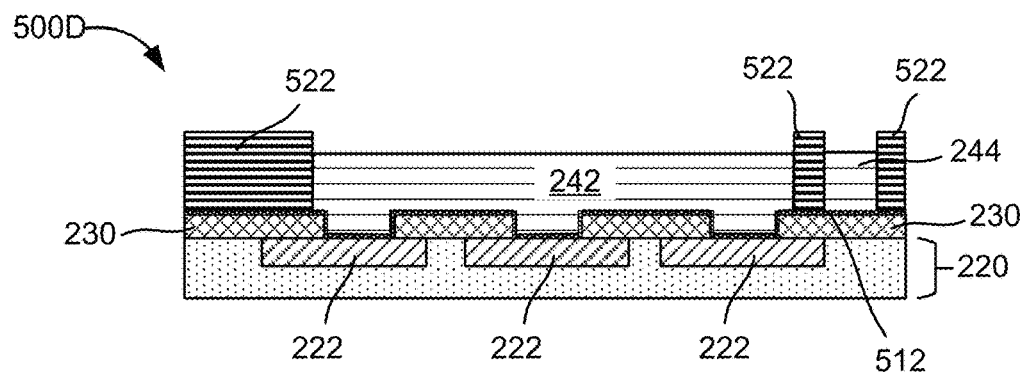

As shown in FIG. 5D, a structure 500D is formed based on the structure 500C by depositing conductive materials into the openings among the patterned photoresist layer 522 to form one or more first bump line structures 242 and 244. In some aspects, the one or more first bump line structures 242 and 244 may comprise copper of greater than 90 wt %. In some aspects, the one or more first bump line structures 242 and 244 may be formed based on a deposition process. In some aspects, the deposition process may comprise an electroplating process.

In some aspects, the patterns of the patterned photoresist layer 522 (and therefore the one or more first bump line structures 242 and 244) may be formed based on a first minimum line width and a first minimum line spacing. In some aspects, the first minimum line width may be equal to or greater than 1.0 µm, and the first minimum line spacing may be equal to or greater than 1.0 µm. In some aspects, the first minimum line width may be equal to or greater than 1.5 or 1.8 µm, and the first minimum line spacing may be equal to or greater than 1.5 or 1.8 µm.

Figure 5E:
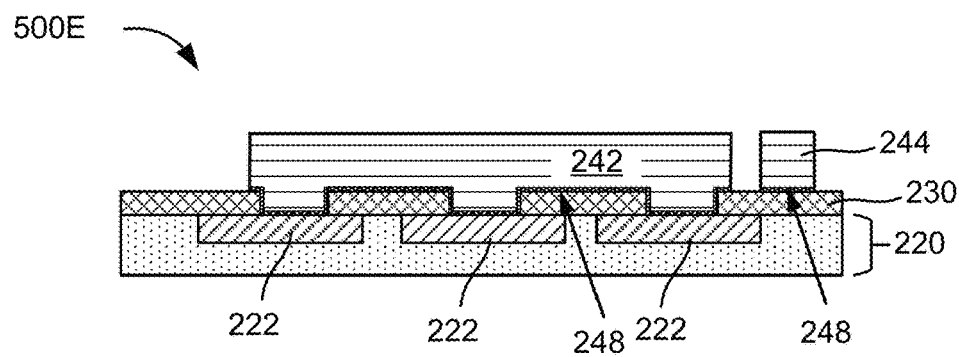

As shown in FIG. 5E, a structure 500E is formed based on the structure 500D by removing the patterned photoresist layer 522 and a portion of the UBM layer 512 underneath the patterns of the patterned photoresist layer 522. In some aspects, the patterned photoresist layer 522 and the portion of the UBM layer 512 underneath of the patterned photoresist layer 522 may be removed by multiple wet chemical cleaning or etching processes based on different etchants or cleaning chemicals. The removal of the portion of the UBM layer 512 underneath of the patterned photoresist layer 522 leaves a UBM structure 248 between the first bump line structures 242 and 244 and the passivation layer 230.

In some aspects, the UBM structure 248 may be omitted. In such scenario, the processing steps corresponding to FIG. 5B may be omitted, and only the patterned photoresist layer 522 is there to be cleaned during the processing steps corresponding to FIG. 5E.

Figure 5F:
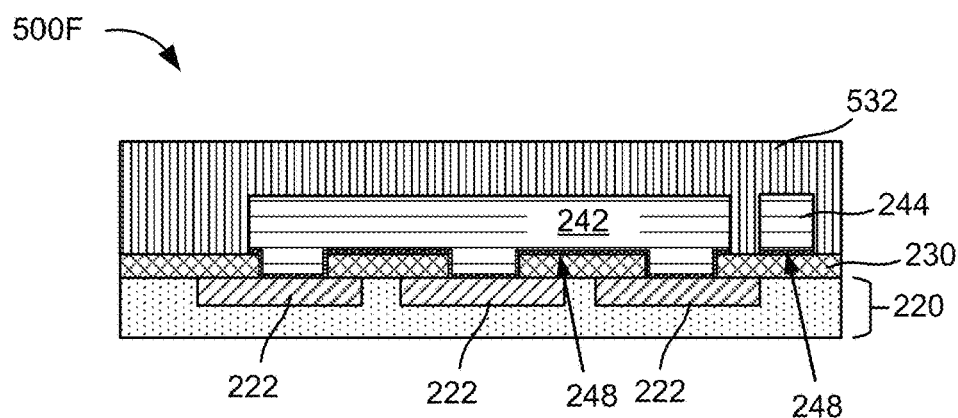

As shown in FIG. 5F, a structure 500F is formed based on the structure 500E by forming a layer of polymer protection material 532 on the passivation layer 260 and upper surfaces of the one or more first bump line structures 242 and 244. In some aspects, the layer of polymer protection material 532 may include polyimide. In some aspects, the layer of polymer protection material 532 may be formed based on a spin coating process followed by a curing process. In some aspects, the curing process may comprise exposing the spin-coated polymer material in an uncured form to a light source if the polymer is a photo-sensitive polymer.

Figure 5G:
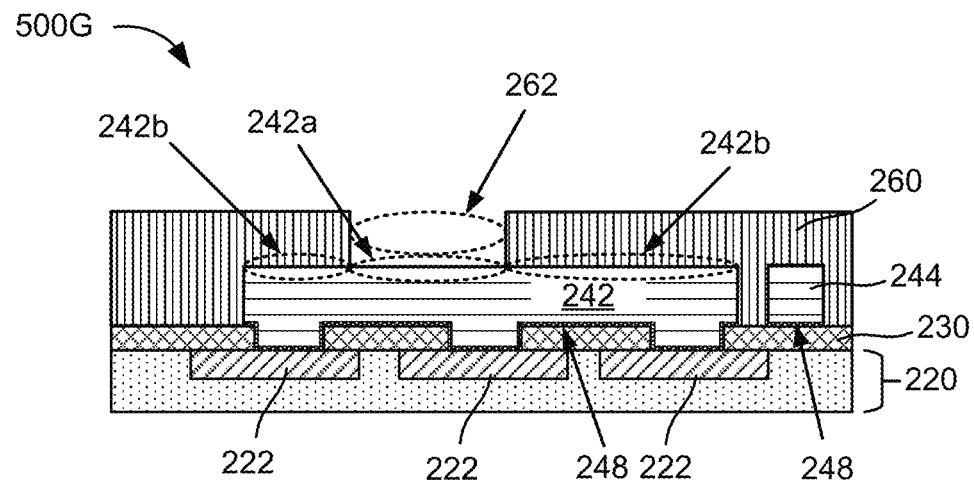

As shown in FIG. 5G, a structure 500G is formed based on the structure 500F by patterning the layer of polymer protection material 532 to become a polymer protection layer 260. The polymer protection layer 260 may have an opening 262 that exposes a first portion 242a of the upper surface of the first bump line structure 242, and the polymer protection layer 260 may still on a second portion 242b of the upper surface of the first bump line structure 242. In some aspects, the forming of the polymer protection layer 260 may be based on a lithographic process to form a mask over the layer of polymer protection material 532, an etching process to form the opening 262, and a cleaning process to remove the mask and residual particles.

Figure 5H:
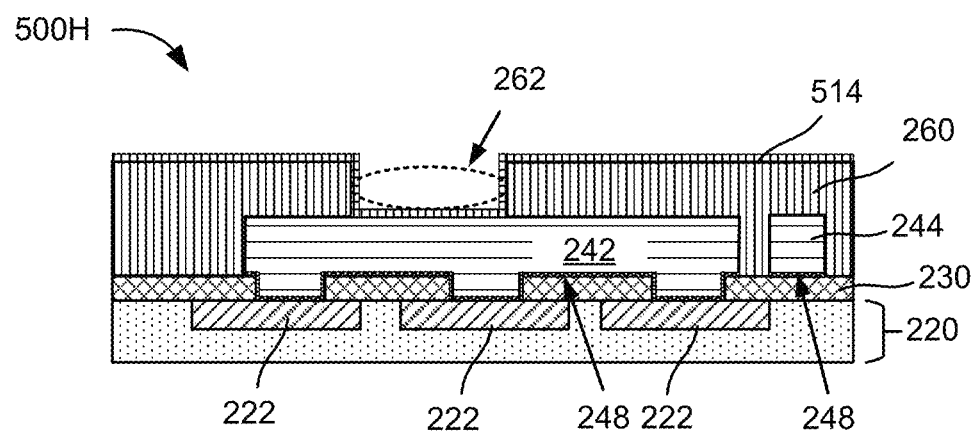

As shown in FIG. 5H, a structure 500H is formed based on the structure 500G by forming a UBM layer 514 on an upper surface of the polymer protection layer 260 and on the bottom and sidewalls of the opening 262. In some aspects, the UBM layer 514 may include layers of materials, which may be a combination of thin layers of titanium, copper, tungsten, or an alloy thereof. In some aspects, the layers of materials of the UBM layer 514 may be formed based on a PVD process.

Figure 5I:
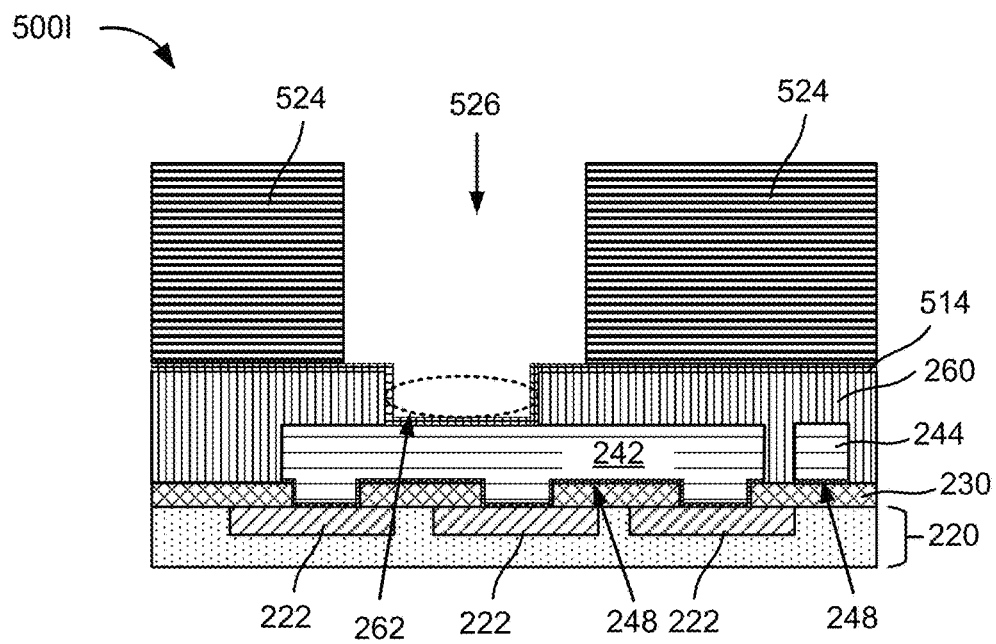

As shown in FIG. 5I, a structure 500I is formed based on the structure 500H by forming a patterned photoresist layer 524 over the UBM layer 514. The patterned photoresist layer 524 has an opening 526 that exposes at least a portion of the UBM layer 514 overlapping the opening 262. The forming of the patterned photoresist layer 524 may include forming a layer of photoresist material, exposing the layer of photoresist material to a light source with a photomask, and developing and removing a portion of the layer of photoresist material and leaving the patterned photoresist layer 524.

Figure 5J:
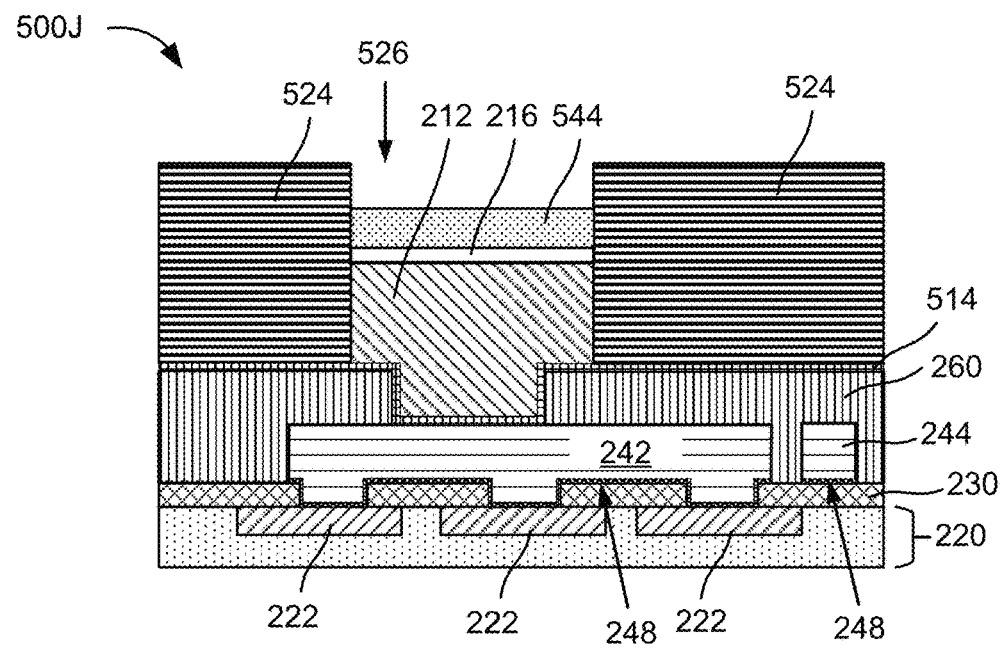

As shown in FIG. 5J, a structure 500J is formed based on the structure 500I by forming in the opening 526 a bump stack that includes a metal pillar 212, a diffusion buffer layer 216 on the metal pillar 212, and a solder layer 544 on the diffusion buffer layer 216. In some aspects, the metal pillar 212 may be a copper pillar that comprises substantially copper. In some aspects, the diffusion buffer layer 216 may comprise nickel. In some aspects, the diffusion buffer layer 216 may be omitted, and the solder layer 544 may be disposed on the metal pillar 212. In some aspects, each of the metal pillar 212, the diffusion buffer layer 216, and the solder layer 544 may be formed based on an electroless plating, an electroplating process, or a combination thereof.

Figure 5K:
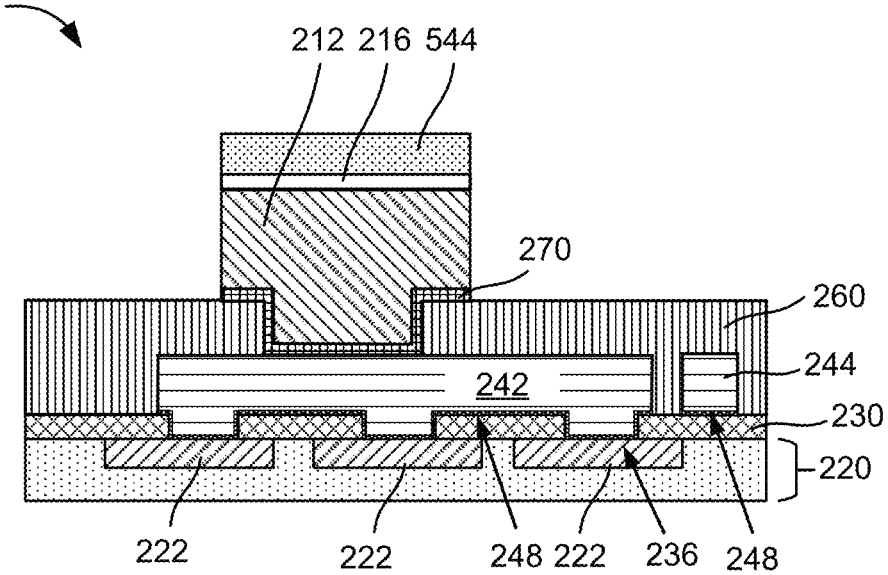

As shown in FIG. 5K, a structure 500K is formed based on the structure 500J by removing the patterned photoresist layer 524 and a portion of the UBM layer 514 underneath the patterns of the patterned photoresist layer 524. In some aspects, the patterned photoresist layer 524 and the portion of the UBM layer 514 underneath of the patterned photoresist layer 524 may be removed by a same or two separate wet chemical cleaning or etching processes. The removal of the portion of the UBM layer 514 underneath of the patterned photoresist layer 524 leaves a UBM structure 270 between the metal pillar 212 and the first bump line structure 242.

In some aspects, the UBM structure 270 may be omitted. In such scenario, the processing steps corresponding to FIG. 5H may be omitted, and only the patterned photoresist layer 524 is there to be cleaned during the processing steps corresponding to FIG. 5K.

Figure 5L:
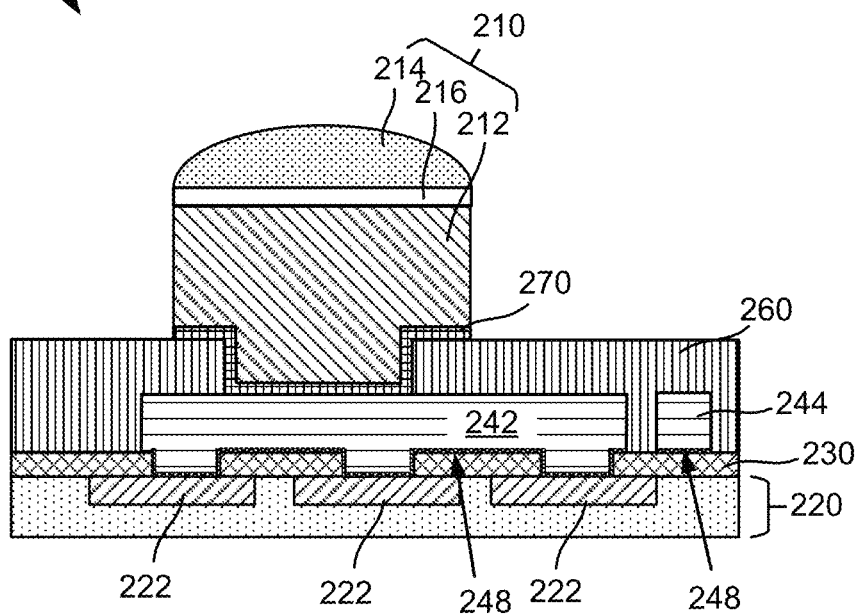

As shown in FIG. 5L, a structure 500L is formed based on the structure 500K by a reflowing process to turn the solder layer 544 into a solder portion 214 of the bump structure 210 on the diffusion buffer layer 216. In some aspects, structure 500L may correspond to the IC device 200A depicted in FIG. 2A.

In some aspects, based on adjusting the size of the pattern of the patterned photoresist layer 524, or based on the size limitation of the patterned photoresist layer 524, the size of the opening 526 may be arranged such that the resulting structure may correspond to the IC device 200B depicted in FIG. 2B. In some aspects, based on omitting the UBM structure 270 and forming the bump structure 210 prior to forming the polymer protection layer 260, the resulting structure may correspond to the IC device 200C depicted in FIG. 2C.

Figure 6A:
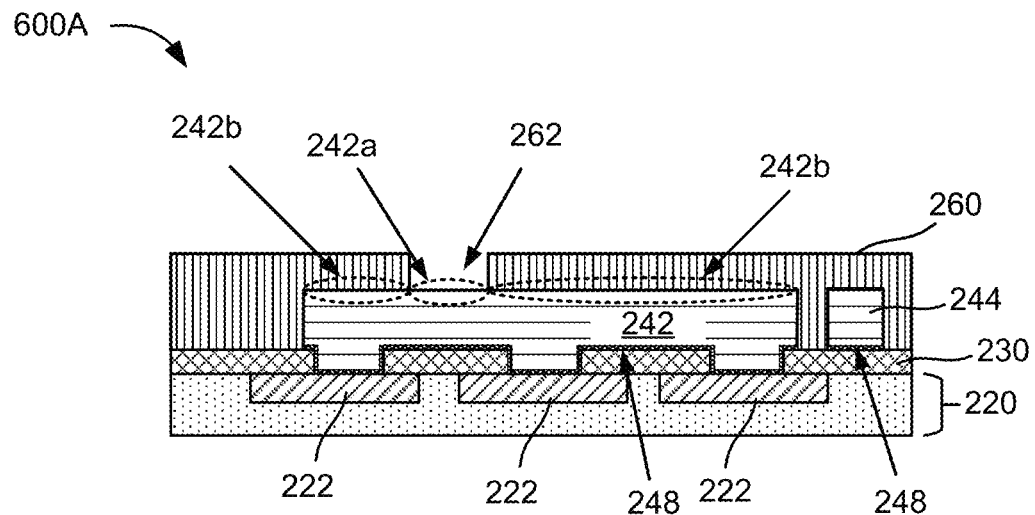
FIGS. 6A-6C illustrate structures at various stages of manufacturing an example IC device of FIG. 3, according to aspects of the disclosure.
Figure 6B:
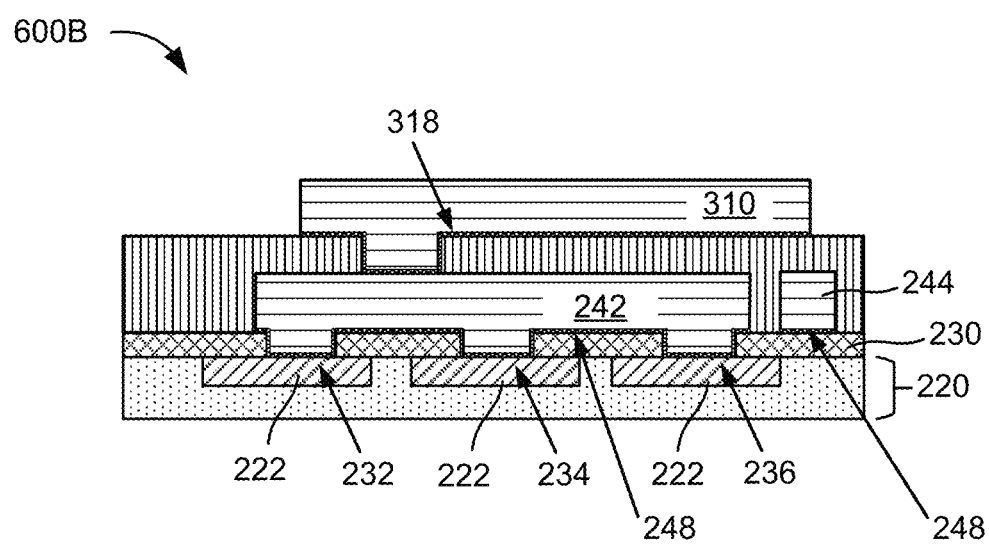
Figure 6C:
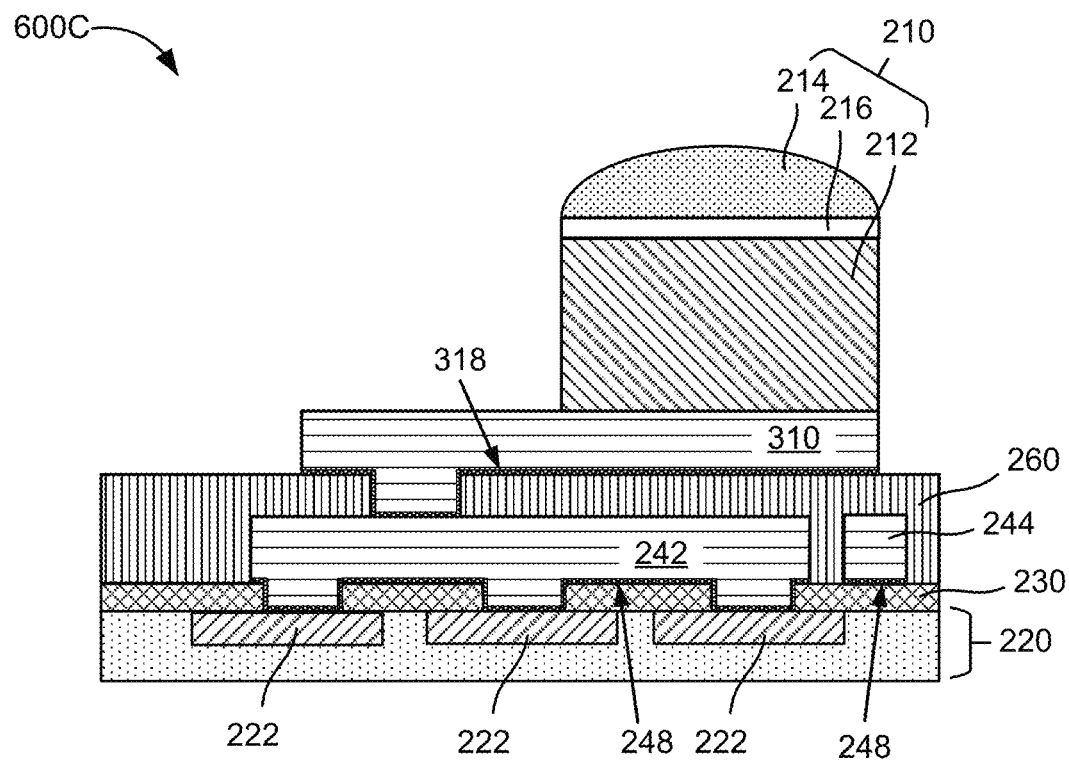

FIGS. 6A-6C illustrate structures at various stages of manufacturing an example IC device 300 of FIG. 3, according to aspects of the disclosure. The components illustrated in FIGS. 6A-6C that are the same or similar to those of FIGS. 3 and 5A-5L are given the same reference numbers, and the detailed description thereof may be omitted.

As shown in FIG. 6A, a structure 600A is formed based on the structure 500F of FIG. 5F by patterning the layer of polymer protection material 532 to become a polymer protection layer 260. The polymer protection layer 260 may have an opening 262 that exposes a first portion 242a of the upper surface of the first bump line structure 242, and the polymer protection layer 260 may still on a second portion 242b of the upper surface of the first bump line structure 242. In some aspects, the steps for forming the structure 600A may be similar to the steps corresponding to FIG. 5G.

As shown in FIG. 6B, a structure 600B is formed based on the structure 600A of FIG. 6A by forming a UBM structure 318 on a portion of an upper surface of the polymer protection layer 260 and on the bottom and sidewalls of the opening 262, and forming a second bump line structure 310 on the UBM structure 318. In some aspects, the UBM structure 318 may be omitted. In some aspects, the steps for forming the structure 600B may be similar to the steps corresponding to FIGS. 5H, 5I, 5C, 5D, and 5F.

In some aspects, the second bump line structure 310 may comprise copper of greater than 90 wt %. In some aspects, the second bump line structure 310 may comprise copper of greater than 99.99 wt %. In some aspects, the second bump line structure 310 may be formed based on a second minimum line width and a second minimum line spacing. In some aspects, the second minimum line width and/or the second minimum line spacing may be the same as or greater than the first minimum line width and/or the first minimum line spacing discussed above. In some aspects, the second minimum line width may be equal to or greater than 5.0 µm, and the second minimum line spacing may be equal to or greater than 5.0 µm. In some aspects, the second minimum line width may be equal to or greater than 10.0 µm, and the second minimum line spacing may be equal to or greater than 10.0 µm.

As shown in FIG. 6C, a structure 600C is formed based on the structure 600B of FIG. 6B by forming a bump structure 210 on a portion of an upper surface of the second bump line structure 310. In some aspects, there may be no UBM structure between the bump structure 210 and the second bump line structure 310. In some aspects, the steps for forming the structure 600C may be similar to the steps corresponding to FIGS. 5I, 5J, 5K, and 5L. In some aspects, structure 600C may correspond to the IC device 300 depicted in FIG. 3.

FIGS. 7A-7E illustrate structures at various stages of manufacturing an example IC device 400A of FIG. 4A, according to aspects of the disclosure. The components illustrated in FIGS. 7A-7E that are the same or similar to those of FIGS. 4A and 5A-5L are given the same reference numbers, and the detailed description thereof may be omitted.

Figure 7A:
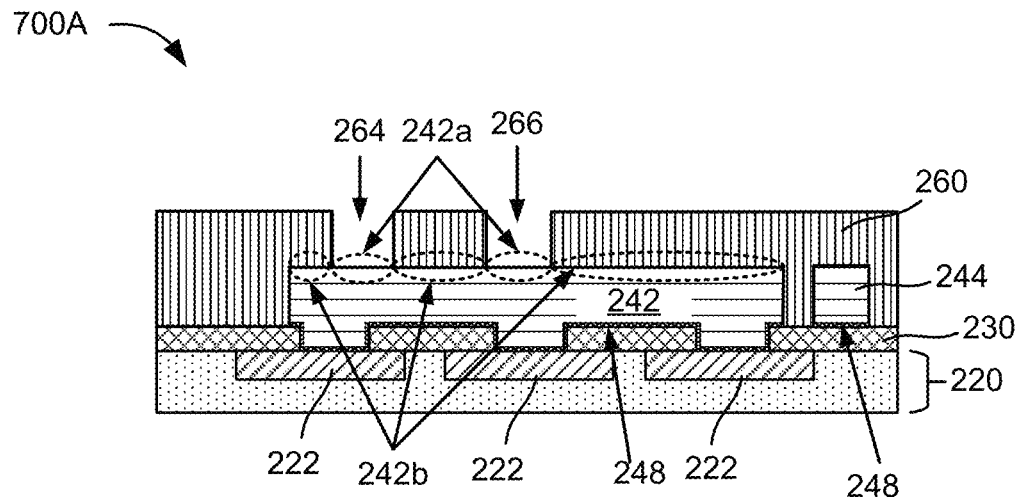
FIGS. 7A-7E illustrate structures at various stages of manufacturing an example IC device of FIG. 4A, according to aspects of the disclosure.

As shown in FIG. 7A, a structure 700A is formed based on the structure 500F of FIG. 5F by patterning the layer of polymer protection material 532 to become a polymer protection layer 260. The polymer protection layer 260 may have one or more openings 264 and 266 that exposes a first portion 242a of the upper surface of the first bump line structure 242, and the polymer protection layer 260 may still on a second portion 242b of the upper surface of the first bump line structure 242. In some aspects, the steps for forming the structure 700A may be similar to the steps corresponding to FIG. 5G.

Figure 7B:
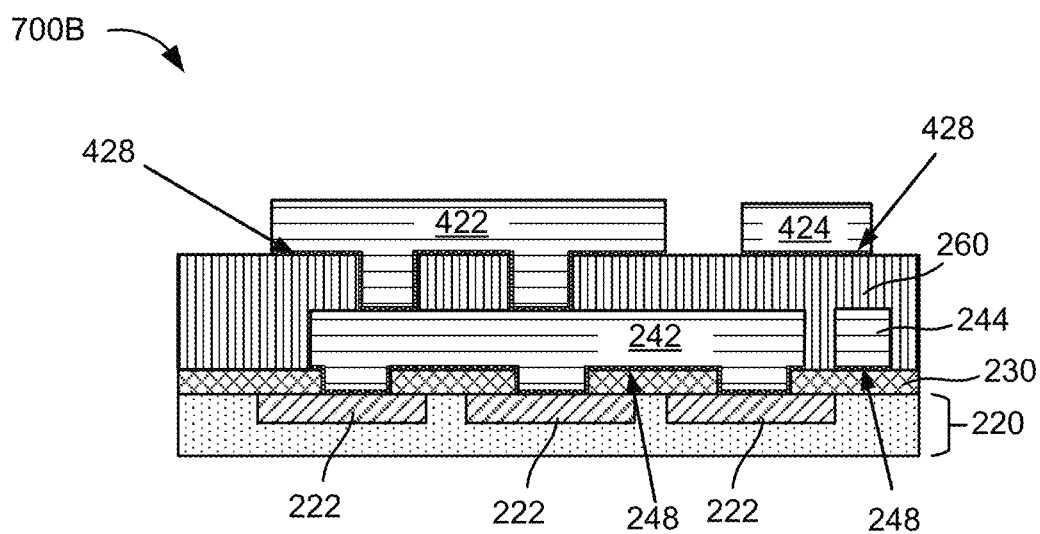

As shown in FIG. 7B, a structure 700B is formed based on the structure 700A of FIG. 7A by forming a UBM structure 428 on a portion of an upper surface of the polymer protection layer 260 and on the bottom and sidewalls of the one or more openings 264 and 266, and forming one or more second bump line structures 422 and 424 on the UBM structure 428. In some aspects, the UBM structure 428 may be omitted. In some aspects, the steps for forming the structure 700B may be similar to the steps corresponding to FIGS. 5H, 5I, 5C, 5D, and 5E.

In some aspects, the one or more second bump line structures 422 and 424 may comprise copper of greater than 90 wt %. In some aspects, the one or more second bump line structures 422 and 424 may comprise copper of greater than 99.99 wt %. In some aspects, the one or more second bump line structures 422 and 424 may be formed based on a second minimum line width and a second minimum line spacing. In some aspects, the second minimum line width and/or the second minimum line spacing may be the same as or greater than the first minimum line width and/or the first minimum line spacing discussed above. In some aspects, the second minimum line width may be equal to or greater than 5.0 µm, and the second minimum line spacing may be equal to or greater than 5.0 µm.

Figure 7C:
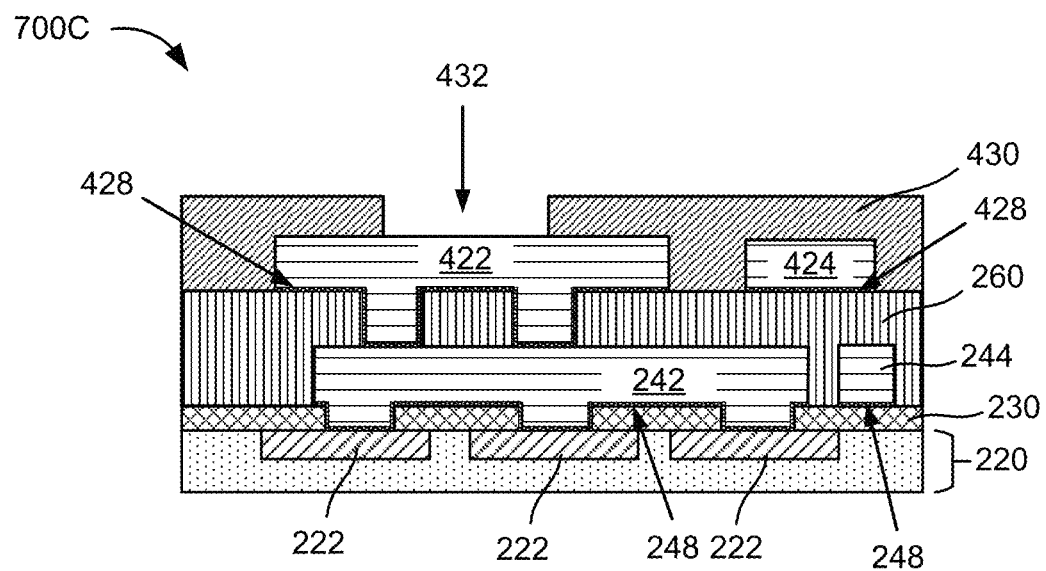

As shown in FIG. 7C, a structure 700C is formed based on the structure 700B of FIG. 7B by forming another polymer protection layer 430 on the polymer protection layer 260. The polymer protection layer 430 may have an opening 432 that exposes a portion of an upper surface of the second bump line structure 422 and still on another portion of the upper surface of the second bump line structure 422 and on the second bump line structure 424. In some aspects, the steps for forming the structure 700C may be similar to the steps corresponding to FIGS. 5F and 5G.

Figure 7D:
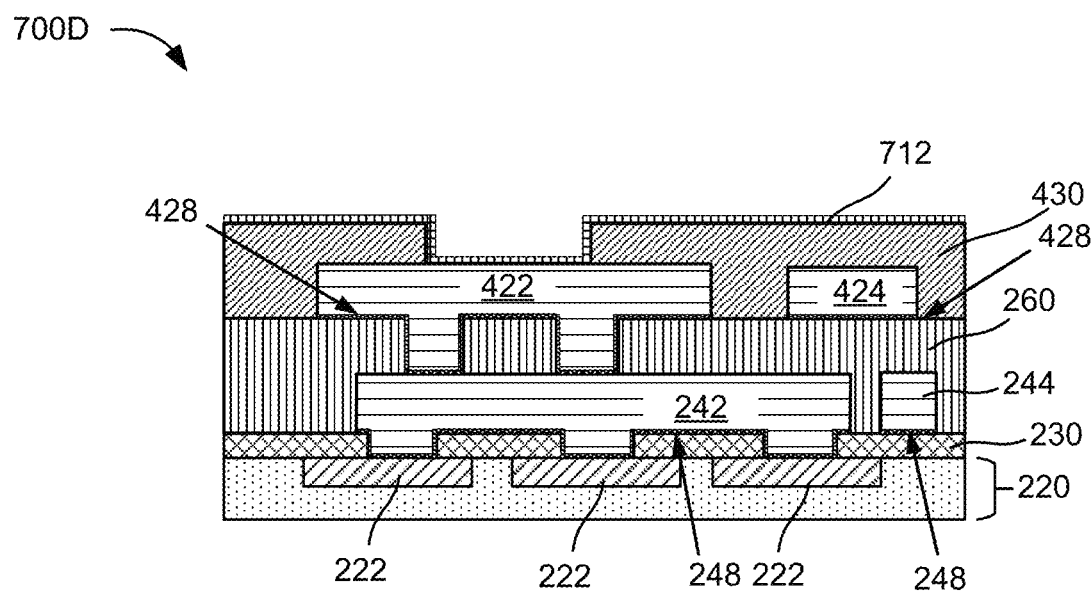

As shown in FIG. 7D, a structure 700D is formed based on the structure 700C of FIG. 7C by forming a UBM layer 712 on an upper surface of the polymer protection layer 430 and on the bottom and sidewalls of the opening 432. In some aspects, the UBM layer 712 may include layers of materials which may be a combination of thin layers of titanium, copper, tungsten, or an alloy thereof. In some aspects, the steps for forming the structure 700D may be similar to the steps corresponding to FIGS. 5B and/or 5H.

Figure 7E:
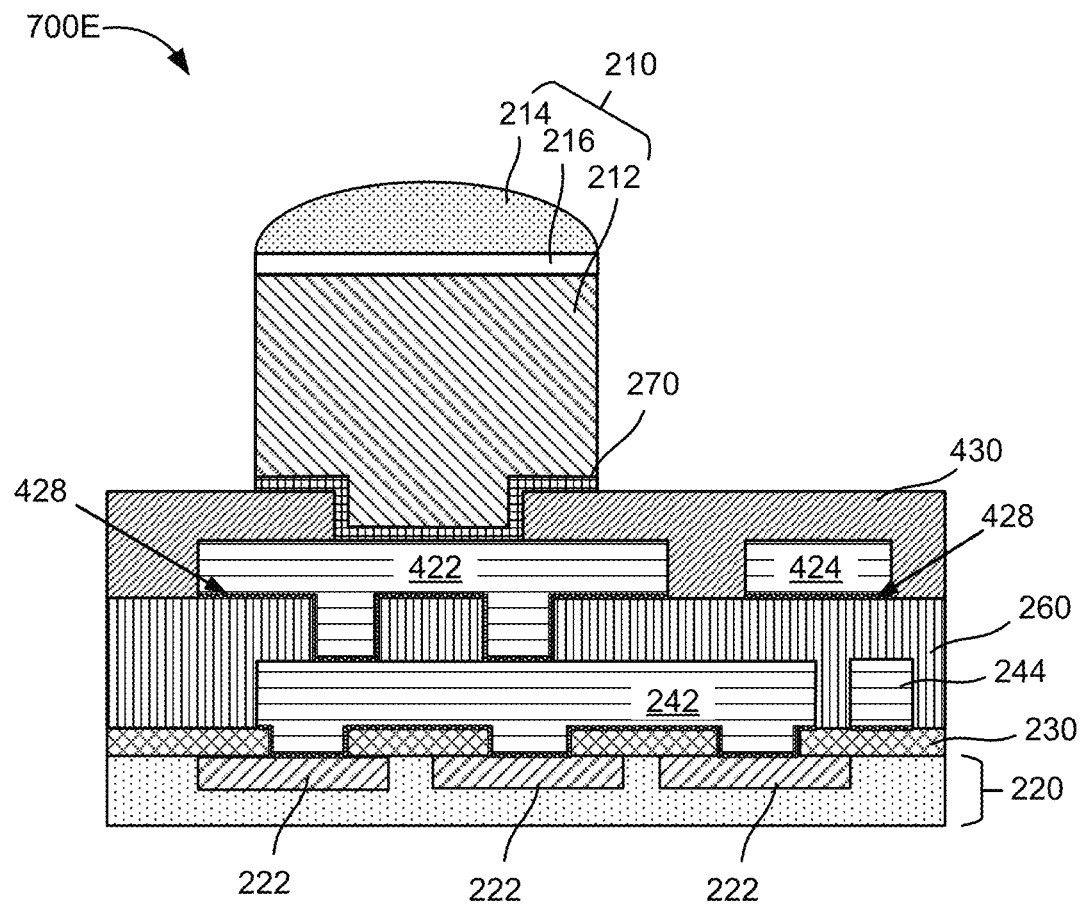

As shown in FIG. 7E, a structure 700E is formed based on the structure 700D of FIG. 7D by removing a portion of the UBM layer 712 to become a UBM structure 270 and forming a bump structure 210 on the UBM structure 270. The bump structure 210 may be over the opening 432 and over a portion of the second bump line structure 422. In some aspects, the steps for forming the structure 700E may be similar to the steps corresponding to FIGS. 5I, 5J, 5K, and 5L. In some aspects, structure 700E may correspond to the IC device 400A depicted in FIG. 4A.

In some aspects, the size of the opening 432 may be arranged such that the resulting structure may correspond to the IC device 400B depicted in FIG. 4B. In some aspects, based on omitting the UBM structure 270 and forming the bump structure 210 prior to forming the polymer protection layer 430, the resulting structure may correspond to the IC device 400C depicted in FIG. 4C.

Figure 8:
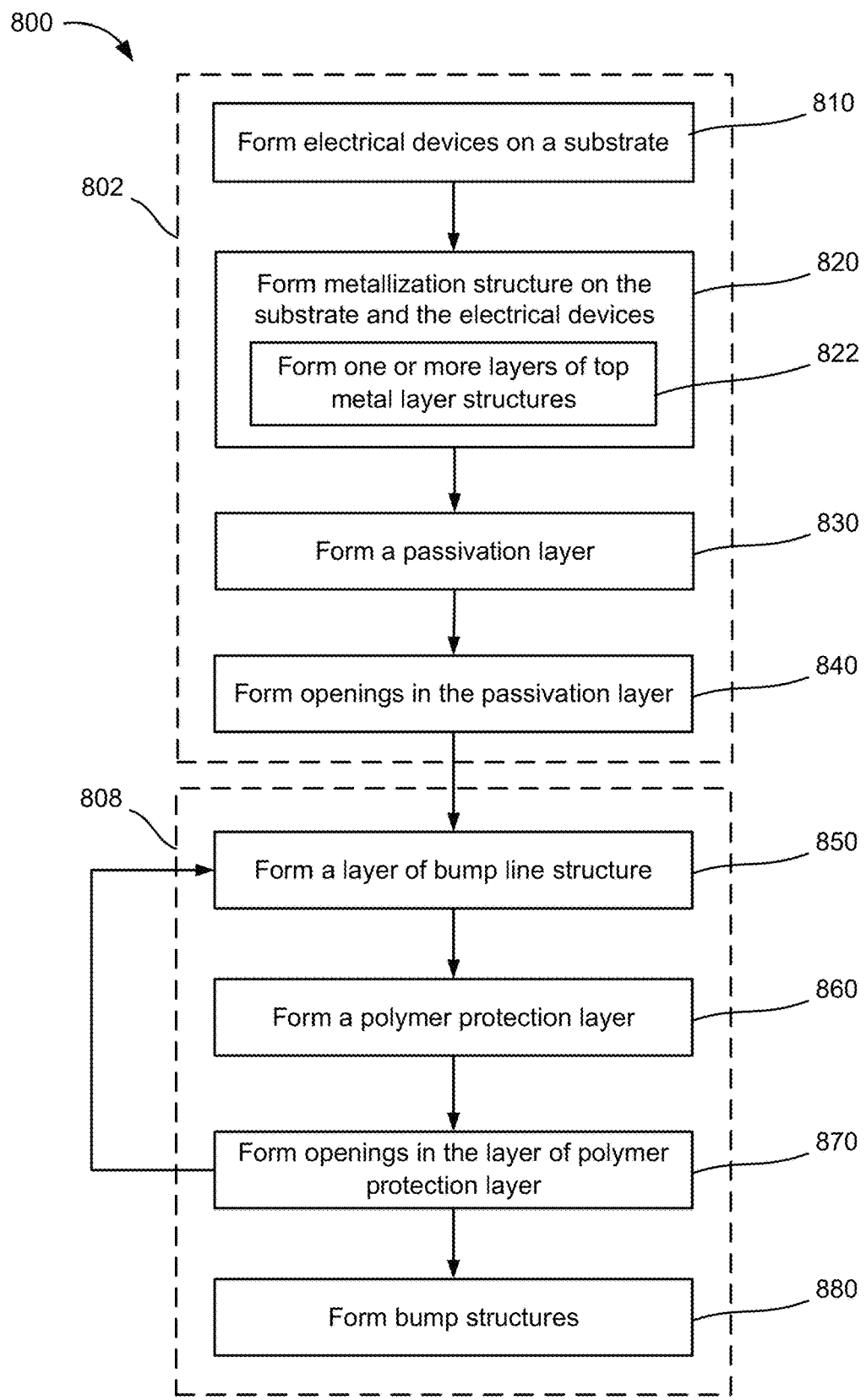
FIG. 8 illustrates a general flow for manufacturing an IC device, according to aspects of the disclosure.

FIG. 8 illustrates a general flow 800 for manufacturing an IC device (such as the IC device examples depicted in FIGS. 2A-4C), according to aspects of the disclosure.

At stage 810, various electrical devices are formed on a substrate. At stage 820, a metallization structure is formed on the electrical devices and the substrate. At stage 820, different layers of conductive structures may be formed, including one or more smaller conductive features each for a shorter electrical connection (e.g., for local routing) and one or more larger conductive features each for a longer electrical connection (e.g., for global routing). In some aspects, as part of or in addition to the one or more conductive features for global connections, one or more layers of top metal layer structures may be formed at the upper portion of the metallization layer at stage 822. In some aspects, the one or more layers of top metal layer structures may be used for providing sufficient mechanical support for mitigating chip-package interaction stress.

In some aspects, the metallization structure formed at stage 820 may correspond to the metallization structure 220 in FIGS. 2A-7E, and the one or more layers of top metal layer structures may include at least the top metal layer structure 222 in FIGS. 2A-7E. In some implementations, the one or more layers of top metal layer structures may include at least two layers of top metal layer structures. In some aspects according to the present application, the bump line structures 242, 310, and/or 422, as well as the polymer protection layer(s) 260 and/or 430, may provide additional mechanical and structural support, and limiting to only one layer of top metal layer structure in the metallization structure may be sufficient for mitigating chip-package interaction stress.

At stage 830, a passivation layer is formed on the metallization structure. At stage 840, one or more openings may be formed in the passivation layer in order to expose one or more portions of the top metal layer structure of the metallization structure. In some aspects, the resulting structure of stage 840 may correspond to the structure 500A in FIG. 5A.

In some aspects, the collection 802 of stages 810-840 may be performed by a semiconductor manufacturing foundry.

At stage 850, a layer of bump line structure may be formed over the passivation layer and the metallization structure. In some aspects, stage 850 may correspond to FIGS. 5B-5E. At stage 860, a polymer protection layer may be formed over the bump line structure and the passivation layer. In some aspects, stage 860 may correspond to FIG. 5F. At stage 870, one or more openings may be formed in the polymer protection layer. In some aspects, stage 870 may correspond to FIGS. 5G, 6A, and 7A.

In some aspects, stages 850, 860, and 870 may be repeated in order to form additional one or more layers of bump line structure and/or polymer protection layer, such as second bump line structures 310, 422, and 424 in FIGS. 3-4C.

At stage 880, the bump structure may be formed over the bump line structure(s) and polymer protection layer(s). In some aspects, stage 870 may correspond to FIGS. 5I-5L.

In some aspects, the collection 808 of stages 850-880 may be performed by a semiconductor manufacturing foundry or an OSAT vendor. In some aspects, compared with a semiconductor manufacturing foundry, an OSAT vendor may perform the collection 808 of stages at a lower cost without compromising the performance of the resulting IC devices.

FIG. 9 illustrates a method 900 for manufacturing an IC device (such as the IC device examples depicted in FIGS. 2A-4C), according to aspects of the disclosure.

At operation 910, a first bump line structure (e.g., the first bump line structure 242) is formed above a passivation layer (e.g., the passivation layer 230) of the integrated circuit device. The integrated circuit device includes a metallization structure (e.g., the metallization structure 220) that includes a top metal layer structure (e.g., the top metal layer structure 222) and the passivation layer on the metallization structure. In some aspects, the passivation layer may include one or more first openings (e.g., the openings 232, 234, and 236) exposing respective one or more portions of the top metal layer structure, the first bump line structure may be electrically coupled to the top metal layer structure, and the first bump line structure may include one or more first extended portions respectively extending toward the one or more portions of the top metal layer structure through the one or more first openings. In some aspects, an UBM structure (e.g., the UBM structure 248) may be formed between the first bump line structure 242 and the passivation layer 230. In some aspects, operation 910 may correspond to the examples shown in FIGS. 5A-5E.

In some aspects, the first bump line structure formed during operation 910 may comprise copper of greater than 90 wt %. In some aspects, the first bump line structure may comprise copper of greater than 99.99 wt %. In some aspects, the first bump line structure may be formed based on a first minimum line width and a first minimum line spacing. In some aspects, the first minimum line width may be equal to or greater than 1.0 µm, and the first minimum line spacing may be equal to or greater than 1.0 µm. In some aspects, the first minimum line width may be equal to or greater than 1.5 or 1.8 µm, and the first minimum line spacing may be equal to or greater than 1.5 or 1.8 µm.

At operation 920, a first polymer protection layer (e.g., the polymer protection layer 260) may be formed on the passivation layer and in contact with a side surface of the first bump line structure. In some aspects, the first polymer protection layer may include an opening (e.g., the opening 262) over a first portion (e.g., the portion 242a) of an upper surface of the first bump line structure, and the first polymer protection layer may be on a second portion (e.g., the portion 242b) of the upper surface of the first bump line structure. In some aspects, the first polymer protection layer may comprise polyimide. In some aspects, operation 920 may correspond to the examples shown in FIGS. 5F-5G, 6A, and/or 7A.

At operation 930, a second bump line structure (e.g., the second bump line structure 310 or 422) over the first polymer protection layer and electrically coupled to the first bump line structure. In some aspects, the second bump line structure may include one or more second extended portions respectively extending toward the first portion of the upper surface of the first bump line structure through one or more second openings (e.g., the openings 262, 264, or 266) of the first polymer protection layer. In some aspects, a UBM structure (e.g., the UBM structure 318 or 428) may be formed between the second bump line structure and the first polymer protection polyimide layer. In some aspects, operation 930 may correspond to the examples shown in FIGS. 6B and/or 7B. In some aspects, operation 930 may be omitted.

In some aspects, the second bump line structure formed during operation 930 may comprise copper of greater than 90 wt %. In some aspects, the second bump line structure may comprise copper of greater than 99.99 wt %. In some aspects, the second bump line structure may be formed based on a second minimum line width and a second minimum line spacing. In some aspects, the second minimum line width and/or the second minimum line spacing may be the same as or greater than the first minimum line width and/or the first minimum line spacing discussed above. In some aspects, the second minimum line width may be equal to or greater than 5.0 µm, and the second minimum line spacing may be equal to or greater than 5.0 µm. In some aspects, the second minimum line width may be equal to or greater than 10.0 µm, and the second minimum line spacing may be equal to or greater than 10.0 µm.

At operation 940, a bump structure (e.g., the bump structure 210) is formed above the first bump line structure and electrically coupled to the first portion of the upper surface of the first bump line structure. In some aspects, when operation 930 is omitted, the bump structure may be formed on the first bump line structure or may be formed on a UBM structure (e.g., the UBM structure 270 in FIG. 2A-2C) that is formed on the first bump line structure. In some aspects, when operation 930 is performed, the bump structure may be formed on the second bump line structure or may be formed on a UBM structure (e.g., the UBM structure 270 in FIGS. 3 and 4A-4C) that is formed on the second bump line structure. In some aspects, when operation 930 is performed, a second polymer protection layer (e.g., the polymer protection layer 430) may be formed on the first polymer protection layer, on a portion (e.g., the portion 422b) of the upper surface of the second bump line structure, and in contact with a side surface of the second bump line structure.

In some aspects, a projection of one of the one or more first openings from a top-view perspective may be within a projection of the bump structure from the top-view perspective. In some aspects, operation 940 may correspond to the examples shown in FIGS. 5H-5K, 6C, and/or 7C-7E.

A technical advantage of the method 900 is that it may be used to form a first bump line structure in place of the metal pad 140 in FIG. 1 with a material (e.g., copper) that has a better conductivity than the material (e.g., aluminum) that is commonly used for the metal pad 140. Also, the process based on the method 900 may be performed by either a semiconductor manufacturing foundry or an OSAT vendor, which may allow the flexibility in selecting the service vendors and/or balancing the overall costs of IC devices manufacturing and distribution.

Figure 10:
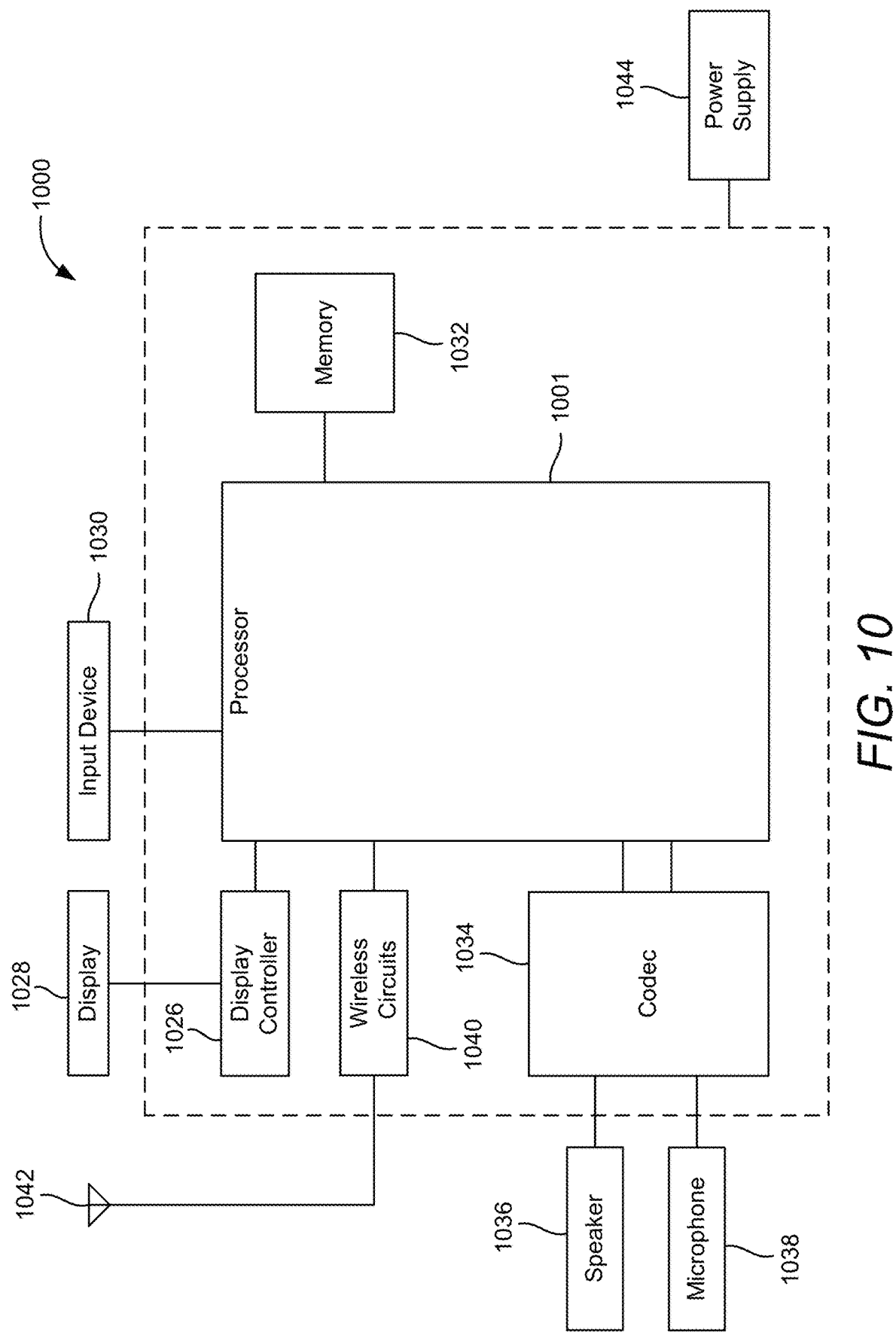
FIG. 10 illustrates a mobile device example, according to aspects of the disclosure.

FIG. 10 illustrates a mobile device 1000, according to aspects of the disclosure. In some aspects, the mobile device 1000 may be implemented by including one or more IC devices manufactured based on the examples described in this disclosure.

In some aspects, mobile device 1000 may be configured as a wireless communication device. As shown, mobile device 1000 includes processor 1001. Processor 1001 may be communicatively coupled to memory 1032 over a link, which may be a die-to-die or chip-to-chip link. Mobile device 1000 also includes display 1028 and display controller 1026, with display controller 1026 coupled to processor 1001 and to display 1028. The mobile device 1000 may include input device 1030 (e.g., physical, or virtual keyboard), power supply 1044 (e.g., battery), speaker 1036, microphone 1038, and wireless antenna 1042. In some aspects, the power supply 1044 may directly or indirectly provide the supply voltage for operating some or all of the components of the mobile device 1000.

In some aspects, FIG. 10 may include coder/decoder (CODEC) 1034 (e.g., an audio and/or voice CODEC) coupled to processor 1001; speaker 1036 and microphone 1038 coupled to CODEC 1034; and wireless circuits 1040 (which may include a modem, RF circuitry, filters, etc.) coupled to wireless antenna 1042 and to processor 1001.

In some aspects, one or more of processor 1001, display controller 1026, memory 1032, CODEC 1034, and wireless circuits 1040 may include one or more IC devices including semiconductor structures manufactured according to the examples described in this disclosure.

It should be noted that although FIG. 10 depicts a mobile device 1000, similar architecture may be used to implement an apparatus including a set top box, a music player, a video player, an entertainment unit, a navigation device, a personal digital assistant (PDA), a fixed location data unit, a computer, a laptop, a tablet, a communications device, a mobile phone, or other similar devices.

Figure 11:
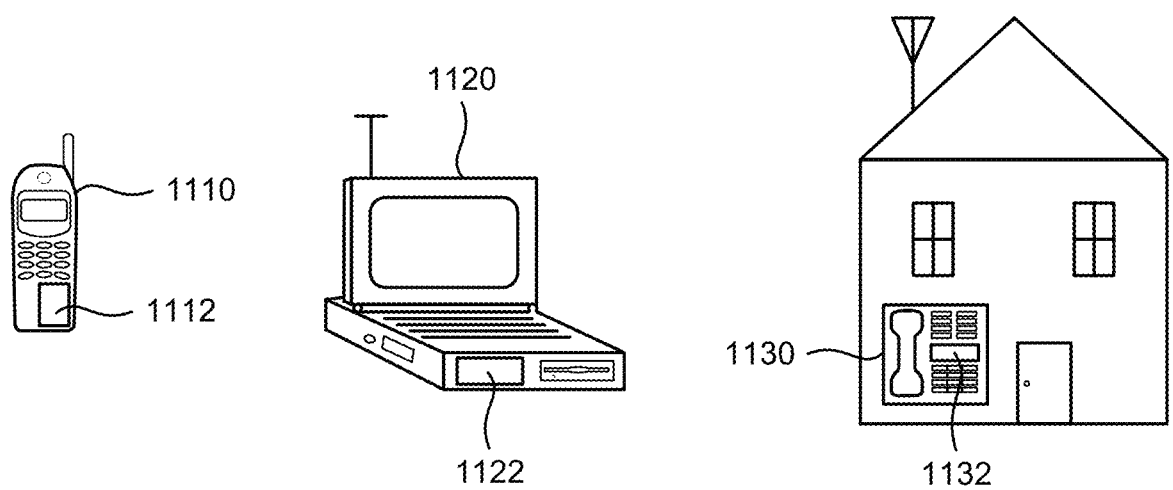
FIG. 11 illustrates various electronic devices that may be integrated with IC devices, according to aspects of the disclosure.

FIG. 11 illustrates various electronic devices 1110, 1120, and 1130 that may be integrated with IC devices 1112, 1122, and 1132, according to aspects of the disclosure. For example, a mobile phone device 1110, a laptop computer device 1120, and a fixed location terminal device 1130 may each be considered generally user equipment (UE) and may include one or more IC devices, such as IC devices 1112, 1122, and 1132, and a power supply to provide the supply voltages to power the IC devices. The IC devices 1112, 1122, and 1132 may be, for example, correspond to an IC device including semiconductor structures manufactured based on the examples described above with reference to FIGS. 2A-7E.

The devices 1110, 1120, and 1130 illustrated in FIG. 11 are merely non-limiting examples. Other electronic devices may also feature the ICs including semiconductor structures as described in this disclosure, including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-11 may be rearranged and/or combined into a single component, process, feature, or function or incorporated in several components, processes, or functions. Additional elements, components, processes, and/or functions may also be added without departing from the disclosure. In some implementations, FIGS. 1-11 and the corresponding description may be used to manufacture, create, provide, and/or produce integrated devices. In some implementations, a device may include a die, an integrated device, a die package, an IC, a device package, an IC package, a wafer, a semiconductor device, a system in package (SiP), a system on chip (SoC), a package on package (PoP) device, and the like.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. UEs can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart).

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. An integrated circuit device, comprising: a metallization structure that includes a top metal layer structure; a passivation layer on the metallization structure, the passivation layer including one or more first openings exposing respective one or more portions of the top metal layer structure; a first bump line structure disposed on the passivation layer and electrically coupled to the top metal layer structure, the first bump line structure including one or more first extended portions respectively extending toward the one or more portions of the top metal layer structure through the one or more first openings; a bump structure above the first bump line structure and electrically coupled to a first portion of an upper surface of the first bump line structure; and a first polymer protection layer on the passivation layer, on a second portion of the upper surface of the first bump line structure, and in contact with a side surface of the first bump line structure.

Clause 2. The integrated circuit device of clause 1, wherein a projection of one of the one or more first openings from a top-view perspective is within a projection of the bump structure from the top-view perspective.

Clause 3. The integrated circuit device of any of clauses 1 to 2, wherein: the first bump line structure comprises copper of greater than 90 weight percentage (wt %).

Clause 4. The integrated circuit device of any of clauses 1 to 3, wherein: the first polymer protection layer comprises polyimide.

Clause 5. The integrated circuit device of any of clauses 1 to 4, wherein the bump structure comprises: a metal pillar; and a solder portion above the metal pillar.

Clause 6. The integrated circuit device of any of clauses 1 to 4, wherein: the bump structure includes a lower portion below an upper surface of the first polymer protection layer, and the first polymer protection layer is in contact with the lower portion of the bump structure.

Clause 7. The integrated circuit device of any of clauses 1 to 4, wherein: the bump structure includes a lower portion below an upper surface of the first polymer protection layer and an upper portion above the upper surface of the first polymer protection layer, and a width of the upper portion of the bump structure is greater than a width of the lower portion of the bump structure.

Clause 8. The integrated circuit device of any of clauses 1 to 4, 6, and 7, further comprising: an under bump metallization (UBM) structure under and in contact with the bump structure.

Clause 9. The integrated circuit device of any of clauses 1-4, further comprising: a second bump line structure over the first polymer protection layer and electrically coupled to the first bump line structure, the second bump line structure including one or more second extended portions respectively extending toward the upper surface of the first bump line structure through one or more second openings of the first polymer protection layer, wherein the bump structure is above the second bump line structure and electrically coupled to the second bump line structure.

Clause 10. The integrated circuit device of clause 9, wherein a projection of one of the one or more second openings from a top-view perspective is within a projection of the bump structure from the top-view perspective.

Clause 11. The integrated circuit device of any of clauses 9 to 10, further comprising: a second polymer protection layer on the first polymer protection layer, on a portion of the upper surface of the second bump line structure, and in contact with a side surface of the second bump line structure.

Clause 12. The integrated circuit device of clause 11, wherein the bump structure is in contact with another portion of the upper surface of the second bump line structure through one or more third openings of the second polymer protection layer.

Clause 13. The integrated circuit device of clause 11, wherein: the bump structure includes a lower portion below an upper surface of the second polymer protection layer, and the second polymer protection layer is in contact with the lower portion of the bump structure.

Clause 14. The integrated circuit device of clause 11, wherein: the bump structure includes a lower portion below an upper surface of the second polymer protection layer and an upper portion above the upper surface of the second polymer protection layer, and a width of an upper portion of the bump structure is greater than a width of the lower portion of the bump structure.

Clause 15. The integrated circuit device of any of clauses 11 to 14, wherein: the first bump line structure is formed based on a first minimum line width and a first minimum line spacing, and the second bump line structure is formed based on a second minimum line width and a second minimum line spacing, and wherein the first minimum line width is less than the second minimum line width, the first minimum line spacing is less than the second minimum line spacing, or both.

Clause 16. The integrated circuit device of clause 15, wherein: the first minimum line width is equal to or greater than 1.0 micrometers (μm), the first minimum line spacing is equal to or greater than 1.0 μm, the second minimum line width is equal to or greater than 5.0 μm, the second minimum line spacing is equal to or greater than 5.0 μm, or a combination thereof.

Clause 17. A method of manufacturing an integrated circuit device, comprising: forming a first bump line structure above a passivation layer of the integrated circuit device, the integrated circuit device comprising a metallization structure that includes a top metal layer structure, and the passivation layer that is on the metallization structure, the passivation layer including one or more first openings exposing respective one or more portions of the top metal layer structure, the first bump line structure being electrically coupled to the top metal layer structure, and the first bump line structure including one or more first extended portions respectively extending toward the one or more portions of the top metal layer structure through the one or more first openings; forming a first polymer protection layer on the passivation layer and in contact with a side surface of the first bump line structure, the first polymer protection layer including an opening exposing a first portion of an upper surface of the first bump line structure, and the first polymer protection layer being on a second portion of the upper surface of the first bump line structure; and forming a bump structure above the first bump line structure and electrically coupled to the first portion of the upper surface of the first bump line structure.

Clause 18. The method of clause 17, wherein a projection of one of the one or more first openings from a top-view perspective is within a projection of the bump structure from the top-view perspective.

Clause 19. The method of any of clauses 17 to 18, wherein: the first bump line structure comprises copper that has a purity of greater than 90 weight percentage (wt %).

Clause 20. The method of any of clauses 17 to 19, wherein: the first polymer protection layer comprises polyimide.

Clause 21. The method of any of clauses 17 to 20, wherein: the bump structure includes a lower portion below an upper surface of the first polymer protection layer, and the forming the bump structure above the first bump line structure is performed such that the first polymer protection layer is in contact with the lower portion of the bump structure.

Clause 22. The method of any of clauses 17 to 21, further comprising: forming an under bump metallization (UBM) structure prior to the forming the bump structure, the UBM being under and in contact with the bump structure.

Clause 23. The method of any of clauses 17 to 20, further comprising: forming a second bump line structure over the first polymer protection layer and electrically coupled to the first bump line structure, the second bump line structure including one or more second extended portions respectively extending toward the upper surface of the first bump line structure through one or more second openings of the first polymer protection layer, wherein the bump structure is above the second bump line structure and electrically coupled to the second bump line structure.

Clause 24. The method of clause 23, wherein a projection of one of the one or more second openings from a top-view perspective is within a projection of the bump structure from the top-view perspective.

Clause 25. The method of any of clauses 23 to 24, further comprising: forming a second polymer protection layer on the first polymer protection layer, on a portion of the upper surface of the second bump line structure, and in contact with a side surface of the second bump line structure.

Clause 26. The method of clause 25, wherein the bump structure includes a lower portion below an upper surface of the second polymer protection layer, and the forming the bump structure above the first bump line structure is performed such that the second polymer protection layer is in contact with the lower portion of the bump structure.

Clause 27. An apparatus, comprising: an integrated circuit device that comprises: a metallization structure that includes a top metal layer structure; a passivation layer on the metallization structure, the passivation layer including one or more first openings exposing respective one or more portions of the top metal layer structure; a first bump line structure above the passivation layer and electrically coupled to the top metal layer structure, the first bump line structure including one or more first extended portions respectively extending toward the one or more portions of the top metal layer structure through the one or more first openings; a bump structure above the first bump line structure and electrically coupled to a first portion of an upper surface of the first bump line structure; and a first polymer protection layer on the passivation layer, on a second portion of the upper surface of the first bump line structure, and in contact with a side surface of the first bump line structure.

Clause 28. The apparatus of clause 27, wherein: the first bump line structure comprises copper of greater than 90 weight percentage (wt %).

Clause 29. The apparatus of any of clauses 27 to 28, wherein: the first polymer protection layer comprises polyimide.

Clause 30. The apparatus of any of clauses 27 to 29, wherein the integrated circuit device further comprises: a second bump line structure over the first polymer protection layer and electrically coupled to the first bump line structure, the second bump line structure including one or more second extended portions respectively extending toward the upper surface of the first bump line structure through one or more second openings of the first polymer protection layer, wherein the bump structure is above the second bump line structure and electrically coupled to the second bump line structure.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An integrated circuit device, comprising:
   a metallization structure that includes a top metal layer structure;
   a passivation layer on the metallization structure, the passivation layer including one or more first openings exposing respective one or more portions of the top metal layer structure;
   a first bump line structure disposed on the passivation layer and electrically coupled to the top metal layer structure, the first bump line structure including one or more first extended portions respectively extending toward the one or more portions of the top metal layer structure through the one or more first openings;
   a bump structure above the first bump line structure and electrically coupled to a first portion of an upper surface of the first bump line structure;
   a first polymer protection layer on the passivation layer, on a second portion of the upper surface of the first bump line structure, and in contact with a side surface of the first bump line structure; and
   a second bump line structure over the first polymer protection layer and electrically coupled to the first bump line structure, the second bump line structure including one or more second extended portions respectively extending toward the upper surface of the first bump line structure through one or more second openings of the first polymer protection layer, wherein the bump structure is above the second bump line structure and electrically coupled to the second bump line structure.

2. The integrated circuit device of claim 1, wherein a projection of one of the one or more first openings from a top-view perspective is within a projection of the bump structure from the top-view perspective.

3. The integrated circuit device of claim 1, wherein:
the first bump line structure comprises copper of greater than 90 weight percentage (wt %).

4. The integrated circuit device of claim 1, wherein:
the first polymer protection layer comprises polyimide.

5. The integrated circuit device of claim 1, wherein the bump structure comprises:
a metal pillar; and
a solder portion above the metal pillar.

6. The integrated circuit device of claim 1, wherein:
the bump structure includes a lower portion below an upper surface of the first polymer protection layer, and
the first polymer protection layer is in contact with the lower portion of the bump structure.

7. The integrated circuit device of claim 1, wherein:
the bump structure includes a lower portion below an upper surface of the first polymer protection layer and an upper portion above the upper surface of the first polymer protection layer, and
a width of the upper portion of the bump structure is greater than a width of the lower portion of the bump structure.

8. The integrated circuit device of claim 1, further comprising:
an under bump metallization (UBM) structure under and in contact with the bump structure.

9. The integrated circuit device of claim 1, wherein a projection of one of the one or more second openings from a top-view perspective is within a projection of the bump structure from the top-view perspective.

10. The integrated circuit device of claim 1, further comprising:
a second polymer protection layer on the first polymer protection layer, on a portion of the upper surface of the second bump line structure, and in contact with a side surface of the second bump line structure.

11. The integrated circuit device of claim 10, wherein the bump structure is in contact with another portion of the upper surface of the second bump line structure through one or more third openings of the second polymer protection layer.

12. The integrated circuit device of claim 10, wherein:
the bump structure includes a lower portion below an upper surface of the second polymer protection layer, and
the second polymer protection layer is in contact with the lower portion of the bump structure.

13. The integrated circuit device of claim 10, wherein:
the bump structure includes a lower portion below an upper surface of the second polymer protection layer and an upper portion above the upper surface of the second polymer protection layer, and
a width of an upper portion of the bump structure is greater than a width of the lower portion of the bump structure.

14. The integrated circuit device of claim 10, wherein:
the first bump line structure is formed based on a first minimum line width and a first minimum line spacing, and
the second bump line structure is formed based on a second minimum line width and a second minimum line spacing, and
wherein the first minimum line width is less than the second minimum line width, the first minimum line spacing is less than the second minimum line spacing, or both.

15. The integrated circuit device of claim 14, wherein:
the first minimum line width is equal to or greater than 1.0 micrometers ($\mu m$),
the first minimum line spacing is equal to or greater than 1.0 $\mu m$,
the second minimum line width is equal to or greater than 5.0 $\mu m$,
the second minimum line spacing is equal to or greater than 5.0 $\mu m$, or
a combination thereof.

16. An apparatus, comprising:
an integrated circuit device that comprises:
a metallization structure that includes a top metal layer structure;
a passivation layer on the metallization structure, the passivation layer including one or more first openings exposing respective one or more portions of the top metal layer structure;
a first bump line structure above the passivation layer and electrically coupled to the top metal layer structure, the first bump line structure including one or more first extended portions respectively extending toward the one or more portions of the top metal layer structure through the one or more first openings;
a bump structure above the first bump line structure and electrically coupled to a first portion of an upper surface of the first bump line structure;
a first polymer protection layer on the passivation layer, on a second portion of the upper surface of the first bump line structure, and in contact with a side surface of the first bump line structure; and
a second bump line structure over the first polymer protection layer and electrically coupled to the first bump line structure, the second bump line structure including one or more second extended portions respectively extending toward the upper surface of the first bump line structure through one or more second openings of the first polymer protection layer,
wherein the bump structure is above the second bump line structure and electrically coupled to the second bump line structure.

17. The apparatus of claim 16, wherein:
the first bump line structure comprises copper of greater than 90 weight percentage (wt %).

18. The apparatus of claim 16, wherein:
the first polymer protection layer comprises polyimide.

19. A method of manufacturing an integrated circuit device, comprising:
forming a first bump line structure above a passivation layer of the integrated circuit device, the integrated circuit device comprising a metallization structure that includes a top metal layer structure, and the passivation layer that is on the metallization structure, the passivation layer including one or more first openings exposing respective one or more portions of the top metal layer structure, the first bump line structure being electrically coupled to the top metal layer structure, and the first bump line structure including one or more first extended portions respectively extending toward the one or more portions of the top metal layer structure through the one or more first openings;

forming a first polymer protection layer on the passivation layer and in contact with a side surface of the first bump line structure, the first polymer protection layer including an opening exposing a first portion of an upper surface of the first bump line structure, and the first polymer protection layer being on a second portion of the upper surface of the first bump line structure;

forming a bump structure above the first bump line structure and electrically coupled to the first portion of the upper surface of the first bump line structure; and forming a second bump line structure over the first polymer protection layer and electrically coupled to the first bump line structure, the second bump line structure including one or more second extended portions respectively extending toward the upper surface of the first bump line structure through one or more second openings of the first polymer protection layer, wherein the bump structure is above the second bump line structure and electrically coupled to the second bump line structure.

20. The method of claim 19, wherein a projection of one of the one or more first openings from a top-view perspective is within a projection of the bump structure from the top-view perspective.

21. The method of claim 19, wherein:
the first bump line structure comprises copper that has a purity of greater than 90 weight percentage (wt %).

22. The method of claim 19, wherein:
the first polymer protection layer comprises polyimide.

23. The method of claim 19, wherein:
the bump structure includes a lower portion below an upper surface of the first polymer protection layer, and
the forming the bump structure above the first bump line structure is performed such that the first polymer protection layer is in contact with the lower portion of the bump structure.

24. The method of claim 19, further comprising:
forming an under bump metallization (UBM) structure prior to the forming the bump structure, the UBM being under and in contact with the bump structure.

25. The method of claim 19, wherein a projection of one of the one or more second openings from a top-view perspective is within a projection of the bump structure from the top-view perspective.

26. The method of claim 19, further comprising:
forming a second polymer protection layer on the first polymer protection layer, on a portion of the upper surface of the second bump line structure, and in contact with a side surface of the second bump line structure.

27. The method of claim 26, wherein
the bump structure includes a lower portion below an upper surface of the second polymer protection layer, and
the forming the bump structure above the first bump line structure is performed such that the second polymer protection layer is in contact with the lower portion of the bump structure.

\* \* \* \* \*